United States Patent
Kim et al.

(10) Patent No.: US 11,622,184 B2
(45) Date of Patent: Apr. 4, 2023

(54) ELECTRONIC DEVICE COMPRISING MULTIPLE MICROPHONES

(71) Applicant: Samsung Electronics Co., Ltd., Suwon-si (KR)

(72) Inventors: Jinwoo Kim, Suwon-si (KR); Sujin Jung, Suwon-si (KR); Hakrae Kang, Suwon-si (KR); Heejun Park, Suwon-si (KR); Minseok Shin, Suwon-si (KR); Changhwan Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/250,590

(22) PCT Filed: Aug. 6, 2019

(86) PCT No.: PCT/KR2019/009753
§ 371 (c)(1),
(2) Date: Feb. 5, 2021

(87) PCT Pub. No.: WO2020/032515
PCT Pub. Date: Feb. 13, 2020

(65) Prior Publication Data
US 2021/0321185 A1   Oct. 14, 2021

(30) Foreign Application Priority Data

Aug. 7, 2018   (KR) .................. 10-2018-0092036

(51) Int. Cl.
*H04R 1/04*  (2006.01)
*H05K 5/00*  (2006.01)

(52) U.S. Cl.
CPC ............... *H04R 1/04* (2013.01); *H05K 5/003* (2013.01); *H05K 2201/10083* (2013.01)

(58) Field of Classification Search
CPC ...... H04R 2201/003; H04R 1/06; H04R 1/04; H04R 5/04; H04R 25/609
See application file for complete search history.

(56) References Cited

U.S. PATENT DOCUMENTS

| 2008/0144874 A1 | 6/2008 | Wu et al. |
| 2012/0177237 A1 | 7/2012 | Shukla et al. |

(Continued)

FOREIGN PATENT DOCUMENTS

| JP | H06-213871 A | 8/1994 |
| JP | 2009-100148 A | 5/2009 |

(Continued)

OTHER PUBLICATIONS

Supplementary Partial European Search Report dated Jul. 30, 2021, in connection with European Patent Application No. EP19846859.7, 18 pages.

(Continued)

*Primary Examiner* — Kile O Blair

(57) ABSTRACT

According to an embodiment of the present invention, an electronic device may comprise: a housing; a printed circuit board disposed inside the housing, the printed circuit board comprising a first surface, a second surface facing away from the first surface, and a first through-hole and a second through-hole penetrating the first surface and the second surface; a first microphone disposed on the second surface so as to at least partially overlap the first through-hole when seen from above the first surface; a second microphone disposed on the second surface so as to at least partially overlap the second through-hole when seen from above the first surface; a support member disposed on the first surface, the support member comprising a third surface facing the first surface, a fourth surface facing away from the third surface, a third through-hole at least partially overlapping the first through-hole when seen from above the first surface, (Continued)

and a fourth through-hole at least partially overlapping the second through-hole when seen from above the first surface; a first sound-transmitting member disposed on the fourth surface so as to at least partially overlap the third through-hole; and a second sound-transmitting member disposed on the fourth surface so as to at least partially overlap the fourth through-hole. Various other embodiments may be included.

15 Claims, 14 Drawing Sheets

(56) References Cited

U.S. PATENT DOCUMENTS

| | | | |
|---|---|---|---|
| 2013/0101151 A1 | 4/2013 | Harney et al. | |
| 2013/0251183 A1 | 9/2013 | Doller et al. | |
| 2014/0161295 A1 | 6/2014 | Huang et al. | |
| 2014/0185853 A1 | 7/2014 | Aihara | |
| 2016/0241953 A1* | 8/2016 | Elian | H04R 1/083 |
| 2016/0345086 A1 | 11/2016 | Chamberlin et al. | |
| 2017/0280230 A1 | 9/2017 | Kim et al. | |

FOREIGN PATENT DOCUMENTS

| | | |
|---|---|---|
| JP | 2011-130357 A | 6/2011 |
| KR | 10-1999-0031421 A | 5/1999 |

OTHER PUBLICATIONS

International Search Report and Written Opinion of the International Searching Authority in connection with International Application No. PCT/KR2019/009753 dated Dec. 11, 2019, 8 pages.

Supplementary European Search Report dated Dec. 21, 2021 in connection with European Patent Application No. 19 84 6859, 16 pages.

Korean Intellectual Property Office, "Notice of Preliminary Rejection," dated Jul. 29, 2022, in connection with Korean Patent Application No. KR10-2018-0092036, 13 pages.

Notice of Patent Grant dated Nov. 21, 2022 in connection with Korean Patent Application No. 10-2018-0092036, 5 pages.

* cited by examiner

ELECTRONIC DEVICE COMPRISING MULTIPLE MICROPHONES

CROSS-REFERENCE TO RELATED APPLICATIONS

This application is a 371 National Stage of International Application No. PCT/KR2019/009753, filed Aug. 6, 2019, which claims priority to Korean Patent Application No. 10-2018-0092036, filed Aug. 7, 2018, the disclosures of which are herein incorporated by reference in their entirety.

BACKGROUND

1. Field

An embodiment of the disclosure relates to an electronic device including multiple microphones.

2. Description of Related Art

With the emergence of smartphones, a touch-based user interface (UI) platform, which allows a click on a screen, has been widely utilized, but now a voice-based UI platform is of interest. The voice-based UI platform is based on voice recognition technology, which is a communication scheme between a user and an electronic device, whereby the electronic device can be conveniently managed and controlled through voice, without using hands.

SUMMARY

In a voice-recognition-based platform, multiple microphones (or mics) may be operated so as to more accurately recognize voices or directions, and an electronic device may include spaces (or paths) for allowing sound to be introduced into the respective multiple microphones. However, sound introduced into a space utilized by one microphone may escape to a space utilized by other microphones, and have an impact on the other microphones, which may interrupt accurate voice recognition or direction recognition even when multiple microphones are utilized.

Various embodiments of the disclosure may provide an electronic device including multiple microphones for preventing sound from escaping between spaces for allowing sound to be introduced into the respective multiple microphones.

According to an embodiment of the disclosure, an electronic device may include: a housing; a printed-circuit board, which is disposed in the housing and includes a first surface, a second surface facing a direction opposite a direction faced by the first surface, and a first through-hole and a second through-hole, each of which extends through the first surface and the second surface; a first microphone, which is disposed on the second surface and at least partially overlaps the first through-hole when seen from above the first surface; a second microphone, which is disposed on the second surface and at least partially overlaps the second through-hole when seen from above the first surface; a support member, which is disposed on the first surface and includes a third surface facing the first surface, and a fourth surface facing a direction opposite a direction faced by the third surface, the support member including a third through-hole at least partially overlapping the first through-hole when seen from above the first surface, and a fourth through-hole at least partially overlapping the second through-hole when seen from above the first surface; a first sound-permeable member, which is disposed on the fourth surface and at least partially overlaps the third through-hole; and a second sound-permeable member, which is disposed on the fourth surface and at least partially overlaps the fourth through-hole.

Various embodiments of the disclosure can prevent sound from escaping between spaces for allowing sound to be introduced into respective multiple microphones, thereby securing the performance of accurate voice recognition or direction recognition by means of the multiple microphones.

DETAILED DESCRIPTION

Figure 1:
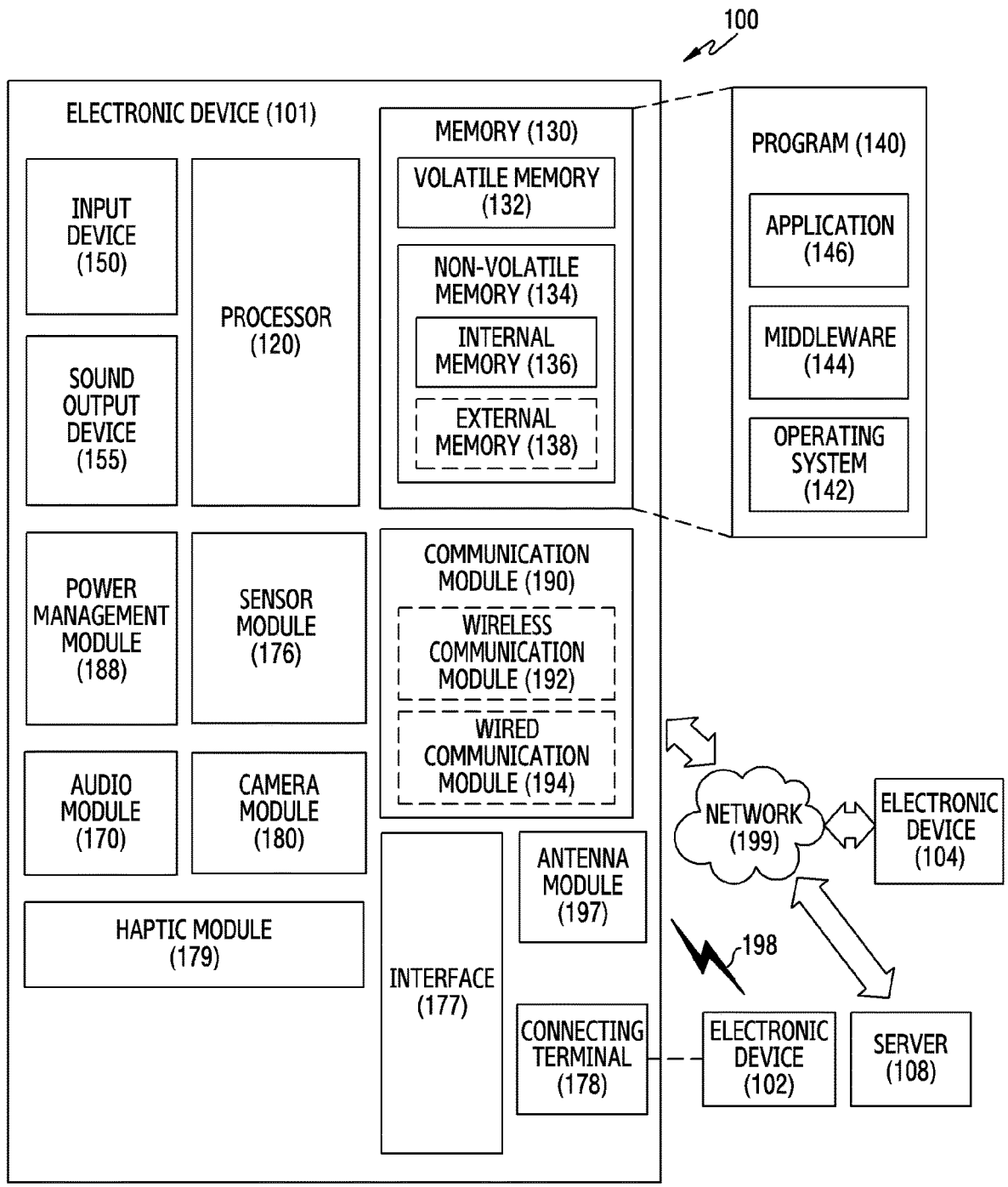
FIG. 1 is a block diagram of an electronic device in a network environment according to an embodiment.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with,"

"coupled to," "connected with," or "connected to" another element (e.g., a second element), it means that the element may be coupled with the other element directly (e.g., wiredly), wirelessly, or via a third element.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, an audio module 170, a voice recognition module 179, a sensor module 176, an interface 177, a camera module 180, a power management module 188, a communication module 190, or an antenna module 197. In some embodiments, at least one (e.g., the camera module 180) of the components may be omitted from the electronic device 101, or one or more other components (e.g., a display device or a battery) may be added in the electronic device 101. In some embodiments, some of the components may be implemented as single integrated circuitry.

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the audio module or the communication module) in volatile memory 132, process the command or the data stored in the volatile memory 132, and store resulting data in non-volatile memory 134.

The memory 130 may store various data used by at least one component (e.g., the processor 120 or the sensor module 176) of the electronic device 101. The various data may include, for example, software (e.g., the program 140) and input data or output data for a command related thererto. The memory 130 may include the volatile memory 132 or the non-volatile memory 134. The program 140 may be stored, for example, as software in the memory 130 and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, one or more microphones.

The sound output device 155 may output sound signals to the outside of the electronic device 101. The sound output device 155 may include, for example, a speaker or a receiver.

The audio module 170 may convert a sound into an electrical signal and vice versa. According to an embodiment, the audio module 170 may obtain the sound via the input device 150 (e.g., one or more microphones), or output the sound via the sound output device 155 (e.g., one or more speakers).

The voice recognition module 179 may, for example, change an acoustic speech signal obtained from a sound sensor included in a microphone or the sensor module 176 included in the input device 150 into words or sentences. The voice recognition module 179 performs a task of removing noise after extracting the sound signal, and then extracting features of the speech signal and comparing the features with the speech model database (DB). According to an embodiment, the voice model database may be stored and managed in an external electronic device (e.g., the server 108), and the voice recognition module 179 may access the external electronic device through the communication module 190.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface. A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS)

communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. According to an embodiment, all or some of operations to be executed at the electronic device 101 may be executed at one or more of the external electronic devices. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The input device 150 may receive a command or data to be used by other component (e.g., the processor 120) of the electronic device 101, from the outside (e.g., a user) of the electronic device 101. The input device 150 may include, for example, a microphone, a mouse, or a keyboard.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

Figure 2:
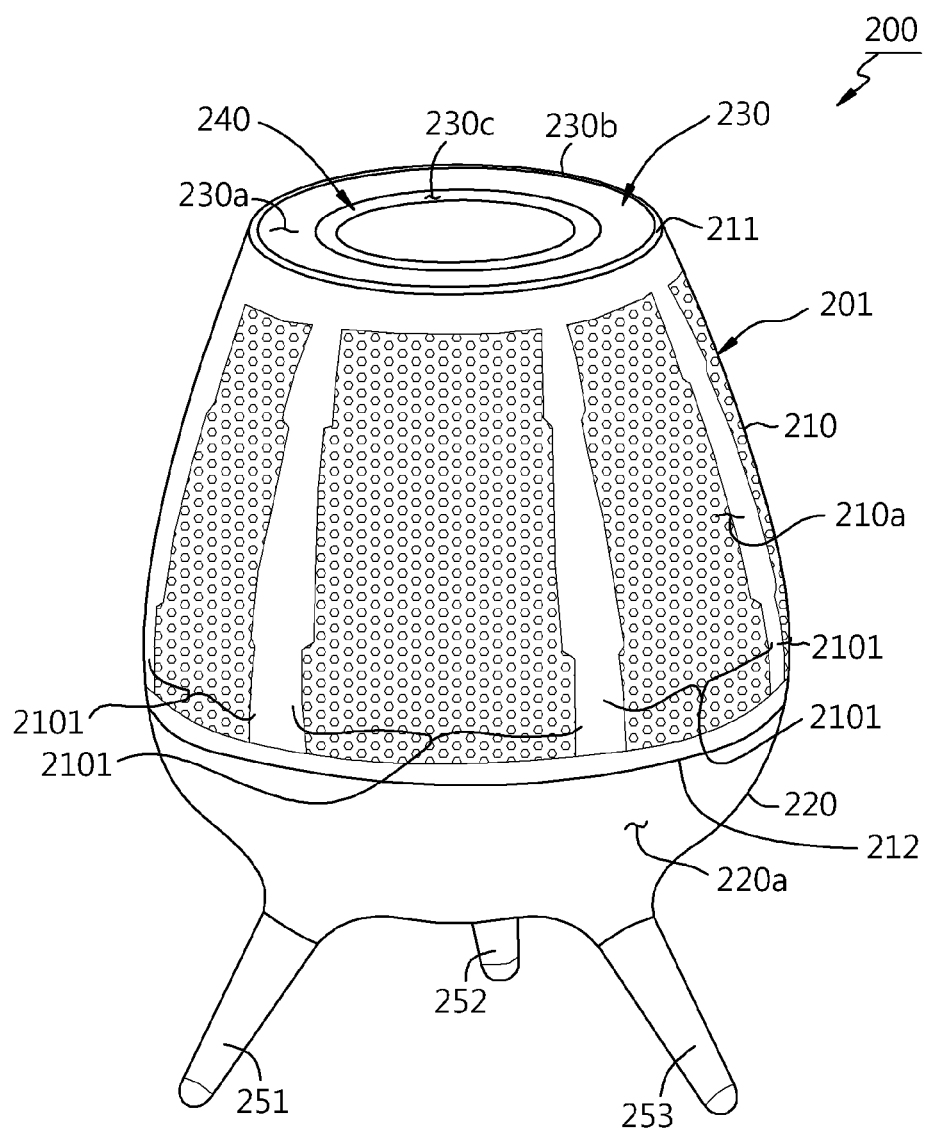
FIG. 2 is a perspective view of an electronic device including multiple microphones according to an embodiment.

FIG. 2 is a perspective view of an electronic device including multiple microphones according to an embodiment.

Referring to FIG. 2, in an embodiment, an electronic device 200 (e.g., the electronic device 101 of FIG. 1) may include a housing 201 forming an exterior of the electronic device 200, and the housing 201 may include at least one of a first exterior member 210, a second exterior member 220, or a third exterior member 230. The first exterior member 210 may include a first edge 211 or a second edge 212 disposed at the opposite side of the first edge 211. In an embodiment, the first exterior member 210 may have a cylindrical shape which becomes narrower along a direction from the second edge 212 toward the first edge 211. For example, the first edge 211 may have a circular shape having a first diameter, and the second edge 212 may have a circular shape having a second diameter greater than the first diameter. The first exterior member 210 may include an opening forming the second edge 212. The second exterior member 220 may be coupled to the second edge 212 of the first exterior member 210, and may have a shape that becomes convex in a direction from the first edge 211 toward the second edge 212. An outer surface 210a formed by the first exterior member 210 and an outer surface 220a formed by the second exterior member 220 may be seamlessly connected with each other. The third exterior member 230 may be coupled to the first edge 211 of the first exterior member 210, and may form a top-side surface 230a of the electronic device 200.

According to an embodiment, the electronic device 200 may include three legs 251, 252, and 253 coupled to the second exterior member 220. The three legs 251, 252, and 253 may be utilized to stand the electronic device 200 on a place such as a floor. Outer surfaces (not shown) of the three legs 251, 252, and 253 and the outer surface 220a of the second exterior member 220 may be seamlessly connected with each other.

According to various embodiments, at least one of the first exterior member 210, the second exterior member 220, or the third exterior member 230 may be formed of various materials such as polymer or metal (for example, aluminum, stainless steel, or magnesium). According to an embodiment, the first exterior member 210 and the third exterior member 230, or the first exterior member 210 and the second exterior member 220, may be integrally formed with each other and may be made of the same material.

According to an embodiment, the third exterior member 230 may include a recess 230c which has a shape recessed toward the second exterior member 220. For example, the third exterior member 230 may be a circular plate which has an edge 230b coupled along the first edge 211. When seen from above the third exterior member 230, the recess 230c may be spaced apart from the edge 230b by a designated distance, and may have a circular shape formed along the edge 230b.

According to an embodiment, although it is not shown, the third exterior member 230 may include multiple microphone holes formed in the recess 230c. The multiple microphone holes may be arranged at regular intervals so as to be aligned with multiple microphones (for example, one or more microphones included in the input device 150 of FIG. 1) arranged in the housing 201 of the electronic device 200. External sound may be introduced into the multiple microphones through the multiple microphone holes.

According to an embodiment, the electronic device 200 may include a fourth exterior member 240 coupled to the recess 230c of the third exterior member 230, and the fourth exterior member 240 may have an annular shape corresponding to that of the recess 230c. According to an embodiment, the fourth exterior member 240 may cover the multiple microphone holes formed in the recess 230c, and may include multiple through-holes to allow sound to pass therethrough. For example, the fourth exterior member 240 (for example, a sound-permeable member such as a grill) may include the multiple through-holes which are formed more minutely and densely than the multiple microphone holes, and external sound may be introduced into the multiple microphone holes in the recess 230c through the multiple through-holes in the fourth exterior member 240.

According to an embodiment, the first exterior member 210 may include groups 2101 (hereinafter, referred to as "multiple first through-hole groups") including multiple through-holes, and the multiple first through-hole groups 2101 may be arranged at regular intervals along the circumference of the first exterior member 210. The multiple first through-hole groups 2101 may be aligned with multiple first speakers arranged in the housing 201, and sound output through the first speaker may be discharged to the outside through the multiple through-holes in the corresponding through-hole group.

According to an embodiment, the second exterior member 220 may include multiple through-holes (hereinafter, referred to as a "second through-hole group") (not shown) arranged on a surface (e.g., a rear surface) opposite the top-side surface 230a. The second through-hole group may be aligned with a second speaker (e.g., a speaker outputting sound having a lower register than that of the first speaker) disposed in the housing 201, and sound output through the second speaker may be discharged to the outside through the second through-hole group. For example, when the electronic device 200 is stood on a floor by the three legs 251, 252, and 253, a space may be formed between the rear surface including the second through-hole group and the floor. The sound output from the second speaker may be discharged to the outside through the space.

Figure 3:
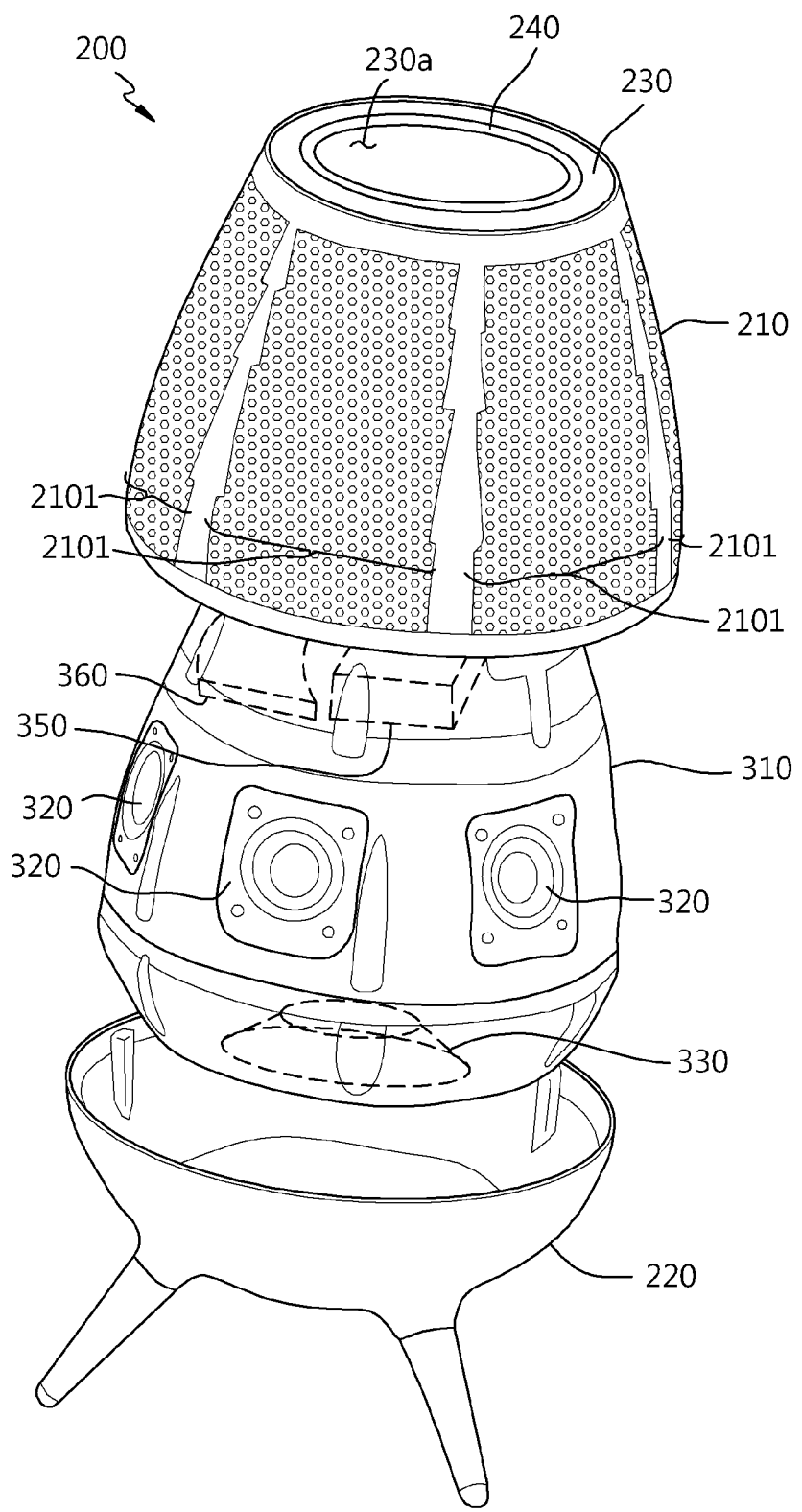
FIG. 3 is an exploded perspective view of the electronic device of FIG. 2.

FIG. 3 is an exploded perspective view of the electronic device of FIG. 2.

Referring to FIG. 3, the electronic device 200 may include at least one of the first exterior member 210, the second exterior member 220, the third exterior member 230, the fourth exterior member 240, an enclosure 310, multiple first speakers 320, or at least one second speaker 330. The first exterior member 210, the second exterior member 220, the third exterior member 230, and the fourth exterior member 240 are substantially the same as those of FIG. 2, and thus a detailed description thereof is omitted.

According to an embodiment, the enclosure 310 is a structure in which the multiple first speakers 320 and the second speaker 330 are included, and may include multiple first openings (not shown) to which the multiple first speakers 320 are coupled, and a second opening (not shown) to which the second speaker 330 is coupled. For example, when the multiple first speakers 320 and the second speaker 330 are coupled to the enclosure 310, the enclosure 310 may have an inner space sealed therein. The multiple first speakers 320 or the second speaker 330 may output sound by using the resonance of the sealed inner space of the enclosure 310. According to an embodiment, the enclosure 310 may include an inner structure having a partition wall for providing multiple first sealed spaces corresponding to the multiple first speakers 320, in the sealed inner space. The multiple first speakers may output sound by using each of the multiple first spaces. According to an embodiment, the second speaker 330 may output sound by using a second space separated from the multiple first spaces by the partition wall in the sealed inner space of the enclosure 310. According to an embodiment, the second speaker 330 may output sound having a lower register than that output from the first speakers 320, and may include, for example, a woofer.

According to an embodiment, the enclosure 310 may be disposed in a space provided by the first exterior member 210 and the second exterior member 220, and may include an exterior which forms a sealed inner space therein by using the space provided by the first exterior member 210 and the second exterior member 220.

According to an embodiment, the enclosure 310 may have an outer surface supported (or fixed) by a structure (e.g., ribs) provided inside the first exterior member 210 or inside the second exterior member 220. There may be a separation space between the first exterior member 210 or the second exterior member 220 and the enclosure 310, and the separation space may reduce the transfer of vibration of the enclosure 310 to the first exterior member 210 and/or the second exterior member 220 when the multiple first speakers 320 or the second speaker 330 output(s) sound.

According to an embodiment, the multiple first speakers 320 may be arranged on the enclosure 310 to be aligned with the multiple first through-hole groups 2101 formed through the first exterior member 210. Vibration plates (not shown) of the multiple first speakers 320 may face the multiple first through-hole groups 2101.

According to an embodiment, the second exterior member 220 may include a second through-hole group (not shown) on a rear surface at the opposite side of the top-side surface 230a. The second speaker 330 may be disposed on the enclosure 310 to be aligned with the second through-hole group. A vibration plate of the second speaker 330 may face the second through-hole group.

According to an embodiment, the electronic device 200 may include circuitry or a structure (hereinafter, referred to as a "power unit") 350 related to power. For example, the power unit 350 may include at least one of a power supply device (e.g., a switched mode power supply (SMPS)) or a third printed-circuit board on which one or more amplifiers related to power are mounted. According to various embodiments, the electronic device 200 may include various heat-radiating structures including a heat-radiating plate (e.g., a heat sink) for discharging heat emitted from the power unit 350, to the outside.

According to an embodiment, the power unit 350 may be spaced apart from the second speaker 330 to have a second space therebetween, the second space being utilized by the second speaker 330, along a direction from the second speaker 330 toward the third exterior member 230, and may be disposed in the enclosure 310. According to an embodiment, the enclosure 310 may include a sidewall for separating the power unit 350 and the second space from each other, or at least some of the power unit 350 may be used as a sidewall for separating the power unit 350 and the second space from each other. For example, the enclosure 310 may include a third space in which the power unit 350 is disposed.

According to an embodiment, the electronic device 200 may further include a second printed-circuit board 360 disposed in the third space. The second printed-circuit board 360 may be utilized as a wire for electrically connecting multiple speakers (e.g., the multiple first speakers 320 and the second speaker 330 of FIG. 3) to the first printed-circuit board (e.g., a printed-circuit board on which the processor 120 or the memory 130 of FIG. 1 is mounted). The second printed-circuit board 360 may reduce the length of a wire between the multiple speakers and the first printed-circuit board, and accordingly, application of electromagnetic influence (e.g., electromagnetic noise) of the wire to other elements (e.g., an antenna) can be reduced.

Figure 4:
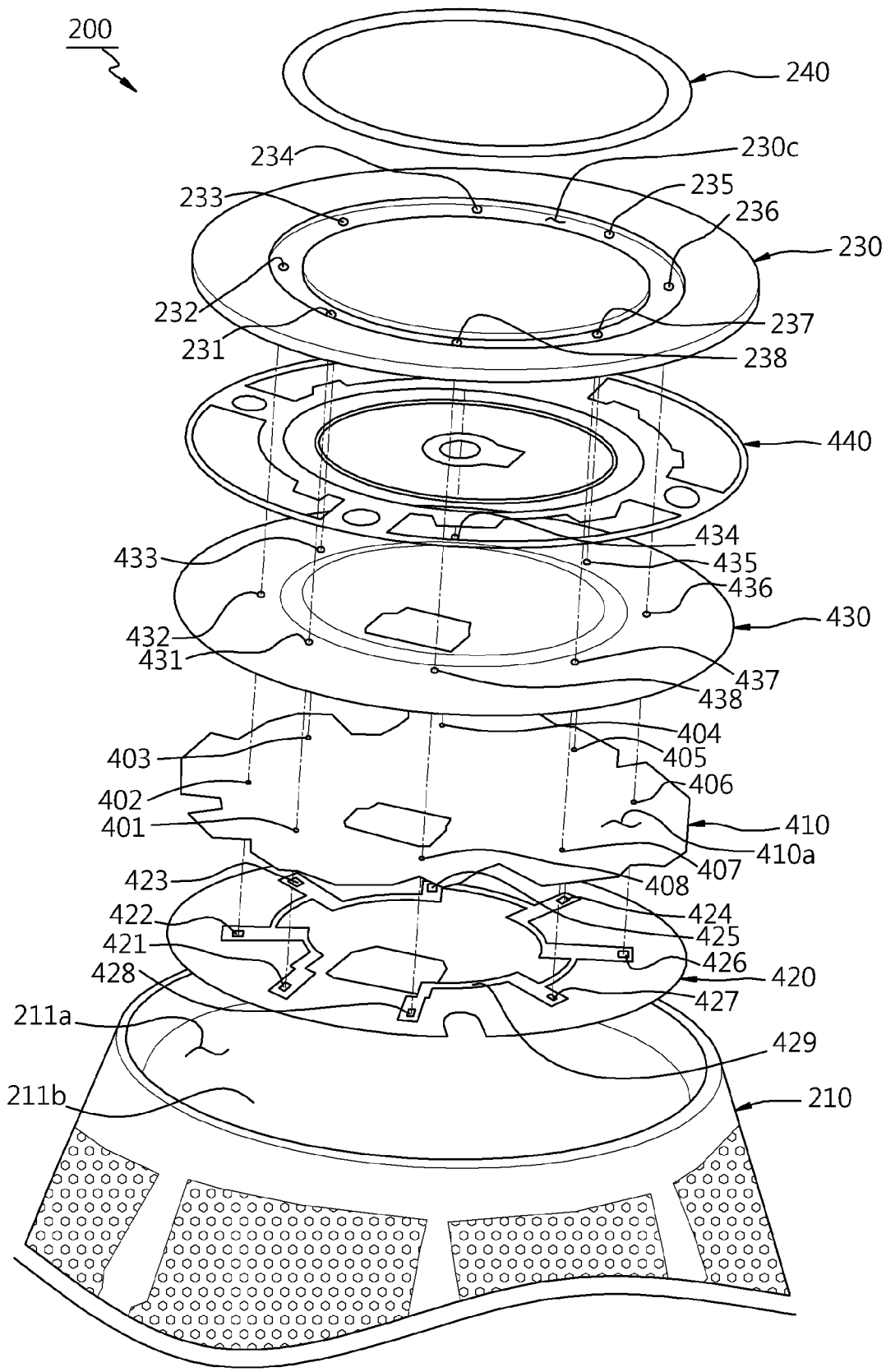
FIG. 4 is an exploded perspective view of the electronic device of FIG. 2.
Figure 5:
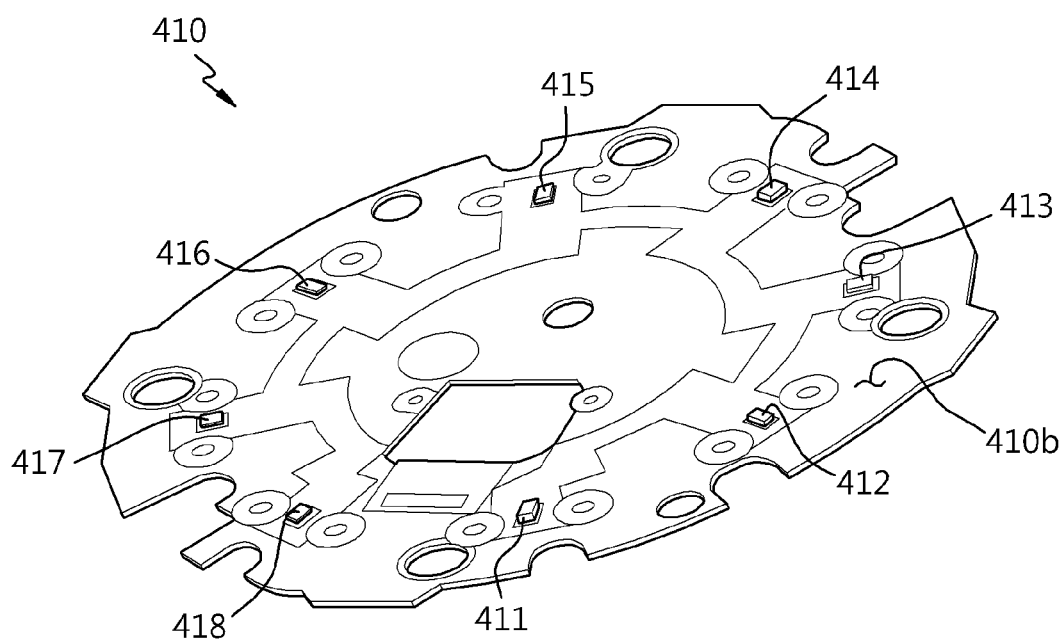
FIG. 5 is a rear perspective view of a first printed-circuit board according to an embodiment.
Figure 6:
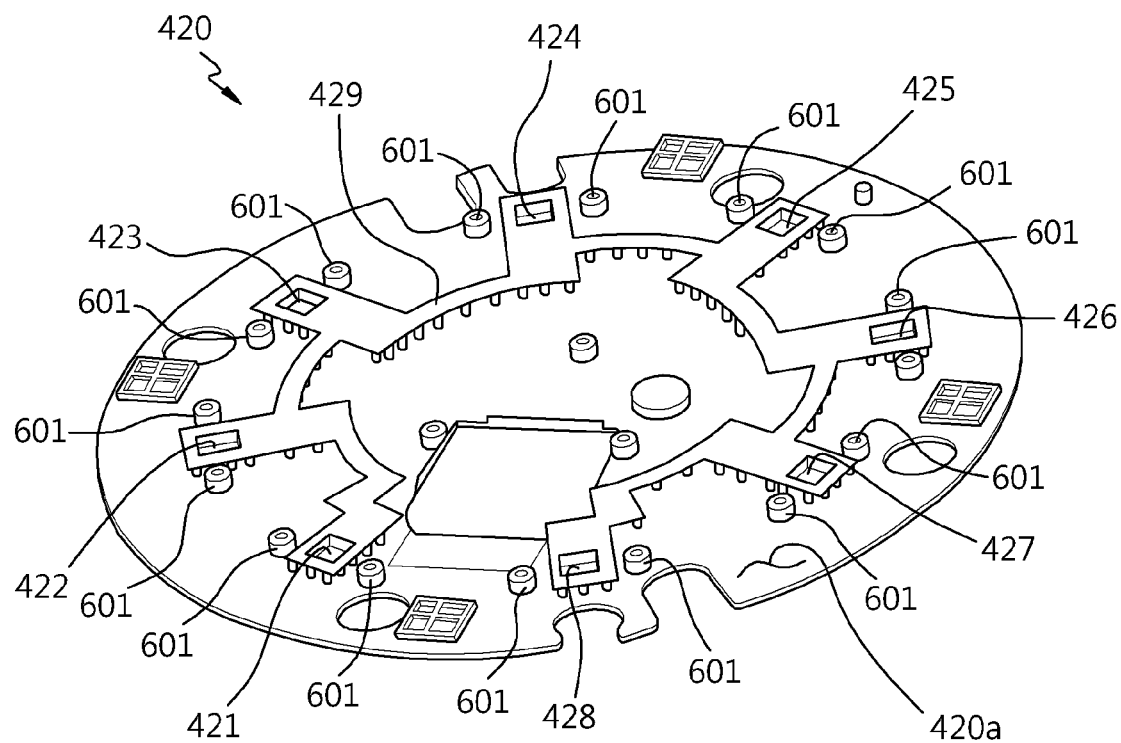
FIG. 6 is a front perspective view of a first support member according to an embodiment.
Figure 7A:
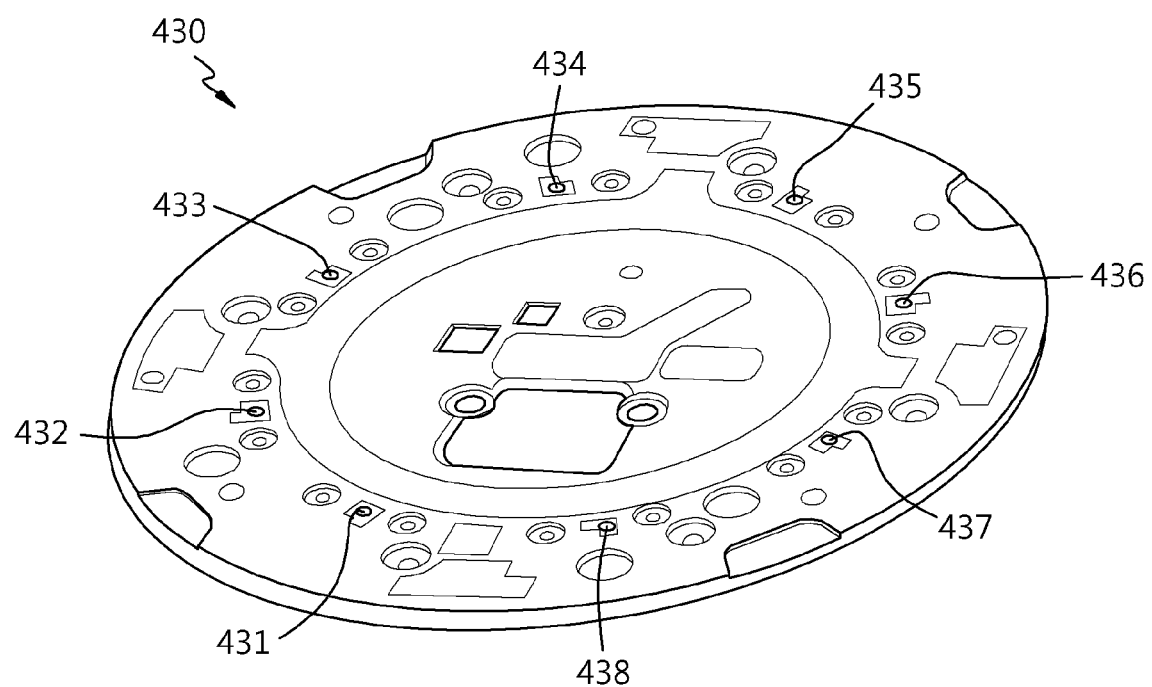
FIG. 7A is a front perspective view of a second support member according to an embodiment.
Figure 7B:
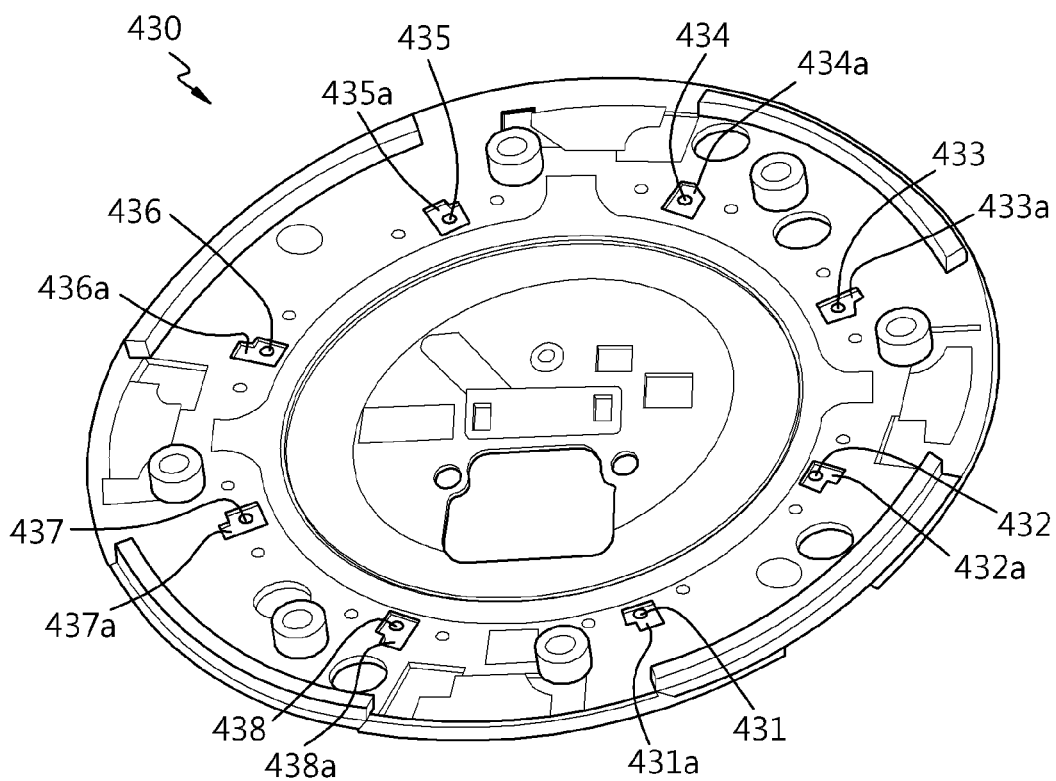
FIG. 7B is a rear perspective view of the second support member of FIG. 7A.
Figure 8:
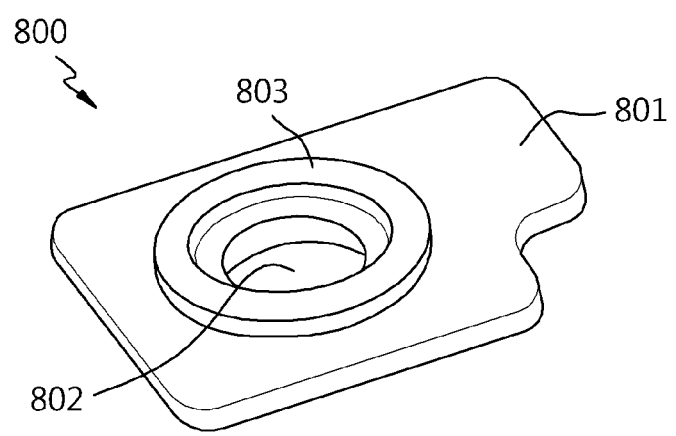
FIG. 8 is a rear perspective view of a second flexible member according to an embodiment.

FIG. 4 is an exploded perspective view of the electronic device of FIG. 2. FIG. 5 is a rear perspective view of a first printed-circuit board according to an embodiment. FIG. 6 is a front perspective view of a first support member according to an embodiment. FIG. 7A is a front perspective view of a second support member according to an embodiment. FIG. 7B is a rear perspective view of the second support member of FIG. 7A. FIG. 8 is a rear perspective view of a second flexible member according to an embodiment.

Referring to FIG. 4, the electronic device 200 may include at least one of the first exterior member 210, the third exterior member 230, the fourth exterior member 240, a first printed-circuit board 410, a first support member 420, a second support member 430, or a coupling member 440.

Referring to FIGS. 4 and 5, in an embodiment, the first printed-circuit board 410 may include a first surface 410a facing the third exterior member 230 and a second surface 410b facing a direction opposite the direction faced by first surface 410a. The first printed-circuit board 410 may include multiple microphones 411, 412, 413, 414, 415, 416, 417, and 418 arranged on the second surface 410b. In an embodiment, when seen from above the second surface 410b, the multiple microphones 411, 412, 413, 414, 415, 416, 417, and 418 may include a first microphone 411, a second microphone 412, a third microphone 413, a fourth microphone 414, a fifth microphone 415, a sixth microphone 416, a seventh microphone 417, or an eighth microphone 418, arranged in a circular shape at regular intervals.

According to an embodiment, the first printed-circuit board 410 may include multiple through-holes 401, 402, 403, 404, 405, 406, 407, and 408 corresponding to the multiple microphones 411, 412, 413, 414, 415, 416, 417, and 418, respectively. External sound may be introduced into the multiple microphones 411, 412, 413, 414, 415, 416, 417, and 418 through the multiple through-holes 401, 402, 403, 404, 405, 406, 407, and 408, respectively.

According to an embodiment, the first printed-circuit board 410 may be electrically connected to a second printed-circuit board (e.g., the second printed-circuit board 360 of FIG. 3) through an electric connection member (not shown) such as a flexible printed-circuit board (FPCB). The first printed-circuit board 410 may be electrically connected to a third printed-circuit board (e.g., the third printed-circuit board of FIG. 3, on which one or more amplifiers are mounted, and which is included in the power unit 350) through the electric connection member (not shown).

According to an embodiment, at least some of the elements of FIG. 1 (e.g., the processor 120, the memory 130, the audio module 170, the voice recognition module 179, the interface 177, the power management module 188, or the communication module 190) may be mounted on the first printed-circuit board 410. For example, the processor 120 or the voice recognition module 179 mounted on the first printed-circuit board 410 may perform voice recognition by using the multiple microphones 411, 412, 413, 414, 415, 416, 417, and 418. For example, the processor 120 may determine the direction, from which a voice originates, by using acoustic signals acquired through the multiple microphones 411, 412, 413, 414, 415, 416, 417, and 418, and may control at least one speaker (e.g., the multiple first speakers 320 and the second speaker 330 of FIG. 3) by using the determined direction (e.g., the processor 120 may output a response to the input voice by using a speaker corresponding to the determined direction).

According to an embodiment, the first exterior member 210 may include a plate 211b extending from the first edge 211 and disposed above an enclosure (e.g., the enclosure 310 of FIG. 3). The first exterior member 210 may include a recess 211a formed by the first edge 211 and the plate 211b to be concave along a direction from the first edge 211 toward the second edge 212. The first printed-circuit board 410, the first support member 420, the second support member 430, and the coupling member 440 may be arranged between the third exterior member 230 and the plate 211b in the recess 211a.

Referring to FIGS. 4 and 6, in an embodiment, the first support member 420 may be disposed between the first printed-circuit board 410 and the plate 211b. The first support member 420 may have a structure of pressing the first printed-circuit board 410 toward the second support member 430, and may have, for example, a plate shape. According to an embodiment, the first support member 420 may include a first flexible member 429 disposed on a surface 420a facing the second surface 410b of the first printed-circuit board 410. For example, the first flexible member 429 (e.g., rubber) may extend along the circular alignment of the multiple microphones 411, 412, 413, 414, 415, 416, 417, and 418 of the first printed-circuit board 410. The first support member 420 may elastically press the first printed-circuit board 410 toward the second support member 430 by the first flexible member 429. According to an embodiment, the first support member 420 may include a pressing structure (e.g., a protruding surface) disposed along the circular alignment of the multiple microphones 411, 412, 413, 414, 415, 416, 417, and 418 of the first printed-circuit board 410, without the first flexible member 429.

According to an embodiment, when the first support member 420 and the first printed-circuit board 410 are coupled to each other, the first support member 420 (or the first flexible member 429) may include multiple recesses (or through-holes) 421, 422, 423, 424, 425, 426, 427, and 428 for allowing the multiple microphones 411, 412, 413, 414, 415, 416, 417, and 418, each of which has a height protruding from the second surface 410b of the first printed-circuit board 410, to be inserted thereinto. The multiple through-holes 421, 422, 423, 424, 425, 426, 427, and 428 may reduce the size of a gap between the first support member 420 and the first printed-circuit board 420.

Referring to FIGS. 4 and 7A, in an embodiment, the second support member 430 may have a structure to be disposed between the third exterior member 230 and the first printed-circuit board 410, and may have, for example, a plate shape. The second support member 430 may include multiple through-holes 431, 432, 433, 434, 435, 436, 437, and 438 aligned with the multiple through holes 401, 402, 403, 404, 405, 406, 407, and 408 in the first printed-circuit board 410, respectively. External sound may be introduced into the multiple through-holes 401, 402, 403, 404, 405, 406, 407, and 408 in the first printed-circuit board 410 through the multiple through-holes 431, 432, 433, 434, 435, 436, 437, and 438 in the second support member 430.

Referring to FIG. 4, in an embodiment, the third exterior member 230 may include multiple through-holes 231, 232, 233, 234, 235, 236, 237, and 238 formed in the recess 230c. The multiple through-holes 231, 232, 233, 234, 235, 236, 237, and 238 may be aligned with the multiple through holes 431, 432, 433, 434, 435, 436, 437, and 438 in the second support member 430, respectively.

According to an embodiment, the multiple through-holes 231, 232, 233, 234, 235, 236, 237, and 238 in the third exterior member 230, the multiple through-holes 431, 432, 433, 434, 435, 436, 437, and 438 in second support member 430, and the multiple through-holes 401, 402, 403, 404, 405, 406, 407, and 408 in the first printed-circuit board 410 may be aligned with one another, respectively, and accordingly, a path through which external sound moves may be designated and separated by each of the multiple microphones 411, 412, 413, 414, 415, 416, 417, and 418.

According to an embodiment, the electronic device 200 may provide multiple paths through which external sound moves to the multiple microphones 411, 412, 413, 414, 415, 416, 417, and 418, respectively. For example, a first path has a structure in which external sound moves to the first microphone 411, and may include through-holes 231, 431, and 401 aligned with the first microphone 411. A second path has a structure in which external sound moves to the second microphone 412, and may include through-holes 232, 432, and 402 aligned with the second microphone 412. A third path has a structure in which external sound moves to the third microphone 413, and may include through-holes 233, 433, and 403 aligned with the third microphone 413. A fourth path has a structure in which external sound moves to the fourth microphone 414, and may include through-holes 234, 434, and 404 aligned with the fourth microphone 414. A fifth path has a structure in which external sound moves to the fifth microphone 415, and may include through-holes 235, 435, and 405 aligned with the fifth microphone 415. A sixth path has a structure in which external sound moves to the sixth microphone 416, and may include through-holes 236, 436, and 406 aligned with the sixth microphone 416. A seventh path has a structure in which external sound moves to the seventh microphone 417, and may include through-holes 237, 437, and 407 aligned with the seventh microphone 417. An eighth path has a structure in which external sound moves to the eighth microphone 418, and may include through-holes 238, 438, and 408 aligned with the eighth microphone 418.

According to an embodiment, the coupling member 440 may be disposed between the second support member 430 and the third exterior member 230, and may allow the third exterior member 230 to be attached to the second support member 430.

According to an embodiment, the coupling member 440 may allow external sound to move from the multiple through-holes 231, 232, 233, 234, 235, 236, 237, and 238 in the third exterior member 230 to the multiple through-holes 431, 432, 433, 434, 435, 436, 437, and 438 in the second support member 430 without escaping. The coupling member 440 may include various adhesive or viscous materials (e.g., double-sided tape).

Referring to FIG. 4, in an embodiment, the electronic device 200 may include multiple second flexible members (not shown) arranged between the first printed-circuit board 410 and the second support member 430. The second flexible members may allow external sound to move from the multiple through-holes 431, 432, 433, 434, 435, 436, 437, and 438 in the second support member 430 to the multiple through-holes 401, 402, 403, 404, 405, 406, 407, and 408 in the first printed-circuit board 410 without escaping.

Referring to FIG. 7B, in an embodiment, the second support member 430 may include multiple recesses 431a, 432a, 433a, 434a, 435a, 436a, 437a, and 438a formed in a surface 430b facing the first printed-circuit board 410, and extending to (or overlapping) the multiple through-holes 431, 432, 433, 434, 435, 436, 437, and 438, respectively. The second flexible members may be mounted in the multiple recesses 431a, 432a, 433a, 434a, 435a, 436a, 437a, and 438a, respectively. Referring to FIG. 8, in an embodiment, a flexible member 800 may include a first portion 801 disposed in a recess 431a, 432a, 433a, 434a, 435a, 436a, 437a, or 438a of the second support member 430. The first portion 801 may have, for example, a plate shape to be fitted in the recess 431a, 432a, 433a, 434a, 435a, 436a, 437a, or 438a. The flexible member 800 may include a through-hole 802 aligned with a through-hole 431, 432, 433, 434, 435, 436, 437, or 438 in the second support member 430.

According to an embodiment, the flexible member 800 may include an adhesive or viscous material disposed between the first portion 801 of the flexible member 800 and a surface of the recess 431a, 432a, 433a, 434a, 435a, 436a, 437a, or 438a, facing the first portion 801. The adhesive or viscous material may allow external sound to move from the through-hole 431, 432, 433, 434, 435, 436, 437, or 438 in the second support member 430 to the through-hole 401, 402, 403, 404, 405, 406, 407, or 408 in the first printed-circuit board 410 without escaping.

According to an embodiment, the flexible member 800 may include a second portion 803 having a circular shape, which extends and protrudes toward the first printed-circuit board 410 around the through-hole 802. The second portion 803 may elastically press the first printed-circuit board 410 between the second support member 430 and the first printed-circuit board 410. The second portion 803 may allow external sound to move from the through-hole 431, 432, 433, 434, 435, 436, 437, or 438 in the second support member 430 to the through-hole 401, 402, 403, 404, 405, 406, 407, or 408 in the first printed-circuit board 410 without escaping.

Referring to FIG. 4, the first printed-circuit board 410, the first support member 420, and the second support member 430 may be coupled to one another by means of bolts. For example, referring to FIG. 6, the first support member 420 may include multiple holes (hereinafter, referred to as "bolt holes") 601 into which bolts are inserted. Each of the first printed-circuit board 410 and the second support member 430 may include multiple bolt holes (not shown) aligned with the multiple bolt holes of the first support member 420, respectively. The plate 211b of the first exterior member 210 may include multiple bosses (not shown) including nuts for fastening ends of the bolts. When the multiple bolts (not shown) are inserted into the multiple bolt holes in the second support member 430, the first printed-circuit board 410, and the first support member 420, and are fastened to the multiple bosses of the first exterior member 210, the first flexible member 429 or the multiple second flexible members may elastically come into close contact with the first printed-circuit board 410 due to the presence of a separation space between the second support member 430, the first printed-circuit board 410, and the first support member 420.

According to various embodiments, the number or positions of microphones may vary, and a structure according thereto may be changed based on the structure proposed in FIG. 4.

According to an embodiment, the electronic device 200 may include a porous member (not shown) aligned with each of the multiple microphones 411, 412, 413, 414, 415, 416, 417, and 418, and the porous member may block the entry of foreign materials such as dust. For example, the porous member may have a mesh shape (or a mesh structure (e.g., metal mesh)).

Figure 9:
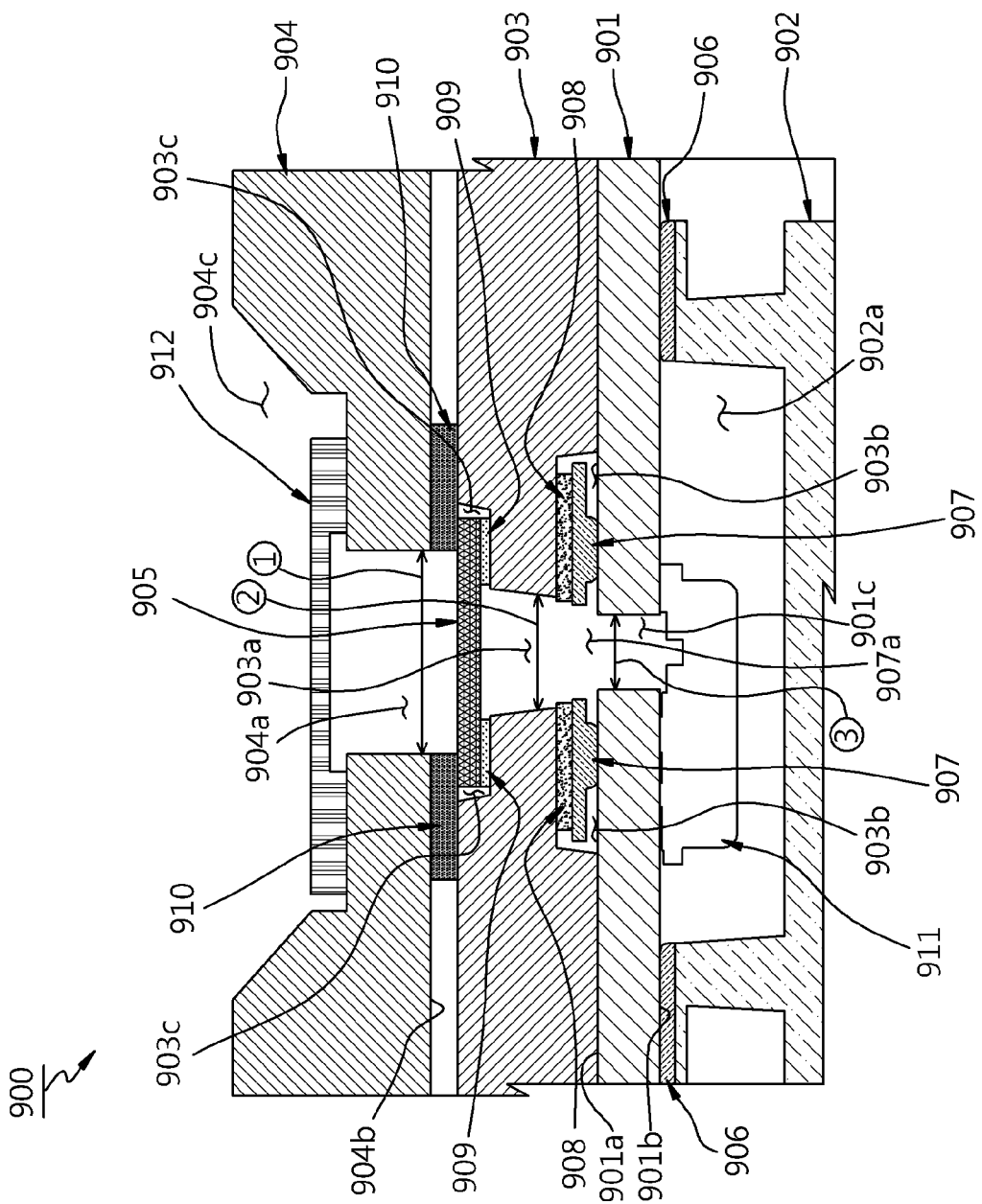
FIG. 9 is a cross-sectional view of an electronic device according to an embodiment.

FIG. 9 is a cross-sectional view of an electronic device according to an embodiment.

Referring to FIG. 9, an electronic device 900 (e.g., the electronic device 400 of FIG. 4) may include at least one of a printed-circuit board 901 (e.g., the first printed-circuit board 410 of FIG. 4), a first support member 902 (e.g., the first support member 420 of FIG. 4), a second support member 903 (e.g., the second support member 430 of FIG. 4), an exterior member 904 (e.g., the third exterior member 230 of FIG. 4), a porous member 905, a first flexible member 906 (e.g., the first flexible member 429 of FIG. 4), a second flexible member 907 (e.g., the second flexible member 800 of FIG. 8), a first coupling member 908, a second coupling member 909, a third coupling member 910, a microphone 911 (e.g., the microphone 411, 412, 413, 414, 415, 416, 417, or 418 of FIG. 5), or a cover member 912 (e.g., the fourth exterior member 240 of FIG. 4).

According to an embodiment, the first printed-circuit board 901 may be disposed between the first support member 902 and the second support member 903. The printed-circuit board 901 may include a first surface 901a (e.g., the first surface 410a of FIG. 4), and a second surface 901b (e.g., the second surface 410b of FIG. 5) facing a direction opposite the direction faced by the first surface 901a. The microphone 911 may be disposed on the second surface 901b of the printed-circuit board 901. According to an embodiment, the printed-circuit board 901 may include a through-hole 901c (e.g., the multiple through-holes 401, 402, 403, 404, 405, 406, 407, and 408 of FIG. 4), and external sound may be introduced into the microphone 911 through the through-hole 901c.

According to an embodiment, the first support member 902 may press the printed-circuit board 901 toward the second support member 903. The first flexible member 906 may be disposed between the first support member 902 and the printed-circuit board 901, and may be supported by the first support member 902, so as to elastically press the printed-circuit board 901. According to an embodiment, the first support member 902 may include a recess 902a (e.g., the recess 421, 422, 423, 424, 425, 426, 427, or 428 of FIG. 6) for allowing the microphone 911, which has a height protruding from the second surface 901b of the printed-circuit board 901, to be inserted thereinto.

According to an embodiment, the second support member 903 may be disposed between the exterior member 904 and the printed-circuit board 901, and may include a through-hole 903a (e.g., the through-hole 431, 432, 433, 434, 435, 436, 437, or 438 of FIG. 7A or FIG. 7B) aligned with the through-hole 901c in the printed-circuit board 901.

According to an embodiment, the second support member 903 may include a recess 903b (e.g., the recess 431a, 432a, 433a, 434a, 435a, 436a, 437a, or 438a of FIG. 7B) formed in a surface facing the printed-circuit board 901, and extending to (or overlapping) the through-hole 903a. According to an embodiment, the second flexible member 907 may be disposed in the recess 903b, and may elastically press the printed-circuit board 901. The second flexible member 907 may include a through-hole 907a (e.g., the through-hole 803 of FIG. 8) aligned with the through-hole 901c in the printed-circuit board 901 or the through-hole 903a in the second support member 903.

According to an embodiment, the first coupling member 908 may be disposed between the second flexible member 907 and a surface of the recess 903b, facing the second flexible member 907, and may include various adhesive or viscous materials (e.g., double-sided tape).

According to an embodiment, the second support member 903 may include a recess 903c formed in a surface facing the exterior member 904, and extending to (or overlapping) the through-hole 903a. According to an embodiment, an edge area (not shown) of the porous member 905 may be disposed in the recess 903c, and may be coupled to the second support member 903 by means of the second coupling member 909. An inner area (not shown) of the porous member may cover the through-hole 903a in the second support member 903 so as to prevent foreign materials such as dust from being introduced into the through-hole 903a.

According to an embodiment, the second coupling member 909 may be disposed between the porous member 905 and a surface of the recess 903c, facing the porous member 905, and may include various adhesive or viscous materials (e.g., double-sided tape).

According to an embodiment, the exterior member 904 may include a through-hole 904a aligned with the through-hole 903a in the second support member 903.

According to an embodiment, the third coupling member 910 may be disposed between the exterior member 904 and the second support member 903, and may include various adhesive or viscous materials (e.g., double-sided tape). The third coupling member 910 may be disposed along an area adjacent to the through-hole 904a in a rear surface 904b of the exterior member 904, facing the second support member 903. According to an embodiment, the third coupling member 910 may cover a portion of the porous member 905 disposed in the recess 903c of the second support member 903. According to various embodiments, the porous member 905 may have a thickness sufficient to reach the third coupling member 910, and may be coupled to the third coupling member 910.

According to an embodiment, the exterior member 904 may include a recess 904c (e.g., the recess 230c of FIG. 4) formed in a surface facing a direction opposite a direction faced by the rear surface 904b thereof, and extending to (or overlapping) the through-hole 904a. The cover member 912 may be disposed in the recess 904c so as to cover the through-hole 904a in the exterior member 904. The cover member 912 may cover the through-hole 904a in the exterior member 904, thereby enhancing the aesthetics of the exterior of the electronic device 900, and may include multiple through-holes for allowing sound to pass therethrough. For example, the cover member 912 may include multiple through-holes throughout the cover member 912 formed more minutely and densely than the through-hole 904a in the exterior member 904.

According to an embodiment, a path which has a structure in which external sound moves to the microphone 911 may include the through-hole 901c in the printed-circuit board 901, the through-hole 903a in the second support member 903, and the through-hole 904a in the exterior member 904, which are aligned with the microphone 911. According to an embodiment, the second flexible member 907 and the first coupling member 908 arranged between the printed-circuit board 901 and the second support member 903 may prevent sound from escaping between the printed-circuit board 901 and the second support member 903 in the path. According to an embodiment, the third coupling member 901 disposed between the exterior member 904 and the second support member 903 may prevent sound from escaping between the exterior member 904 and the second support member 903 in the path.

According to an embodiment, the electronic device 900 may include multiple microphones arranged on the printed-circuit board 901, and may include multiple paths through which external sound moves to the respective multiple microphones. For example, referring to FIG. 4, the first path has a structure in which external sound moves to the first microphone 411, and may include the through-holes 231, 431, and 401 aligned with the first microphone 411. The second path has a structure in which external sound moves to the second microphone 412, and may include the through-holes 232, 432, and 402 aligned with the second microphone 412. The third path has a structure in which external sound moves to the third microphone 413, and may include the through-holes 233, 433, and 403 aligned with the third microphone 413. The fourth path has a structure in which external sound moves to the fourth microphone 414, and may include the through-holes 234, 434, and 404 aligned with the fourth microphone 414. The fifth path has a structure in which external sound moves to the fifth microphone 415, and may include the through-holes 235, 435, and 405 aligned with the fifth microphone 415. The sixth path has a structure in which external sound moves to the sixth microphone 416, and may include the through-holes 236, 436, and 406 aligned with the sixth microphone 416. The seventh path has a structure in which external sound moves to the seventh microphone 417, and may include the through-holes 237, 437, and 407 aligned with the seventh microphone 417. The eighth path has a structure in which external sound moves to the eighth microphone 418, and may include the through-holes 238, 438, and 408 aligned with the eighth microphone 418. The first path, the second path, the third path, the fourth path, the fifth path, the sixth path, the seventh path, or the eight path may be implemented to have a structure for preventing sound from escaping, as shown in the path in FIG. 9, whereby the performance of accuracy of voice recognition or direction recognition can be secured by means of multiple microphones. Elements for preventing sound escapement, disclosed in various embodiments of the document, may be referred to as "sealing members".

Referring to FIG. 9, in an embodiment, the path through which external sound moves to the microphone 911 may have a structure in which the width of the path becomes smaller toward the microphone 911. For example, the through-hole 903a in the second support member 903 may have a width ② larger than the width ③ of the through-hole 901c in the printed-circuit board 901. The through-hole in the exterior member 904 may have a width ① larger than the width ② of the through-hole 903a in the second support member 903. According to various embodiments, the through-hole 903a in the second support member 903 may have a structure in which the width thereof becomes smaller toward the microphone 911. According to various embodiments, although not shown, the through-hole 904a in the exterior member 904 or the through-hole 901c in the printed-circuit board 901 may also have a structure in which the width thereof becomes smaller closer to the microphone 911. The path having the structure in which the width thereof becomes smaller closer the microphone 911 can secure the performance of the microphone 911. When it is assumed that a path has a structure in which the width ② of the through-hole 903a in the second support member 903 is larger than the width ③ of the through-hole 901c in the printed-circuit board 901, or the width ① of the through-hole in the exterior member 904, external sound may undergo diffraction in the through-hole 903a in the second support member 903, whereby the performance of the microphone 911 can be affected.

Figure 10:
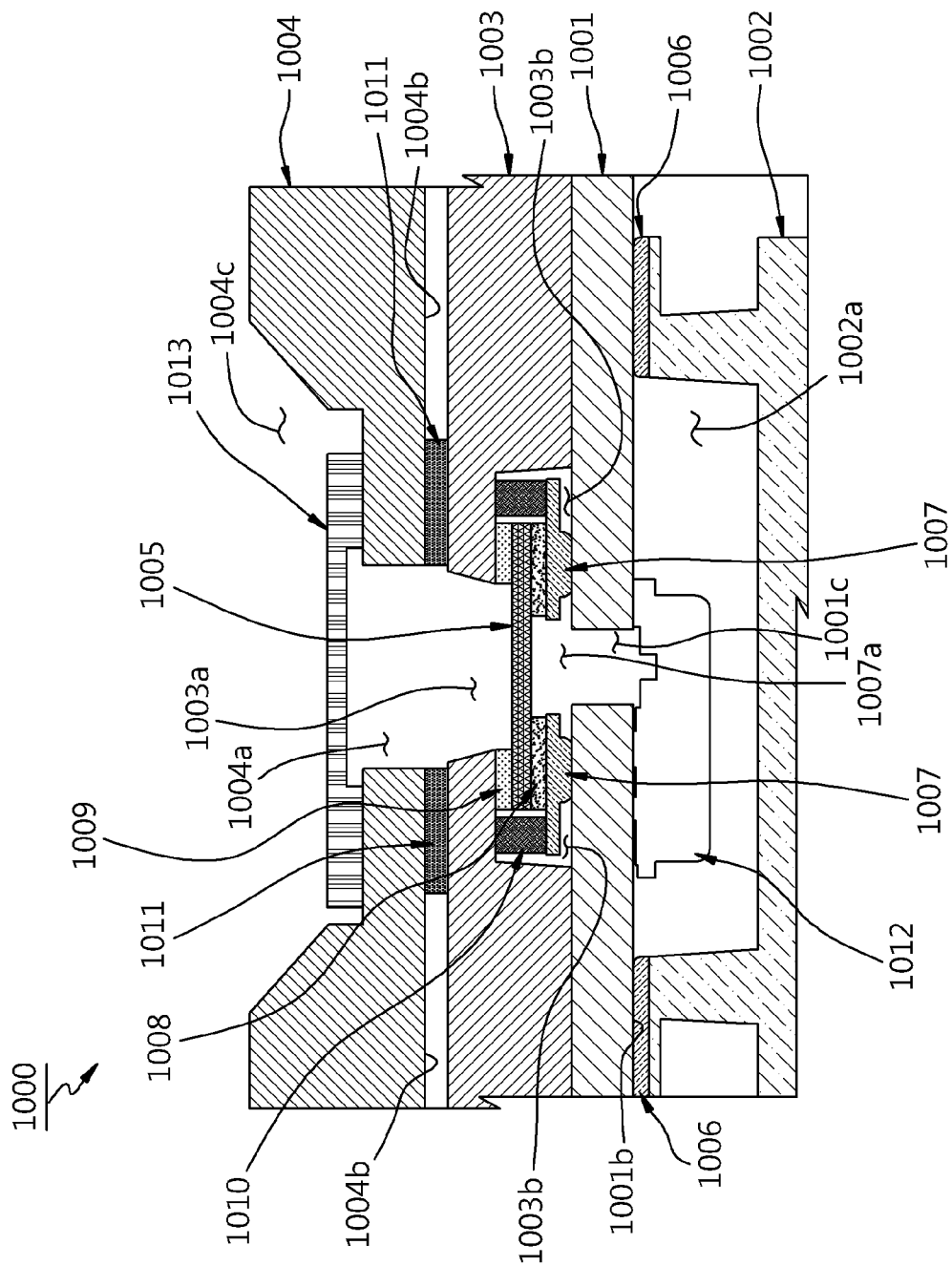
FIG. 10 is a cross-sectional view of an electronic device according to various embodiments.

FIG. 10 is a cross-sectional view of an electronic device according to various embodiments.

Referring to FIG. 10, an electronic device 1000 (e.g., the electronic device 400 of FIG. 4) may include at least one of a printed-circuit board 1001 (e.g., the first printed-circuit board 410 of FIG. 4), a first support member 1002 (e.g., the first support member 420 of FIG. 4), a second support member 1003 (e.g., the second support member 430 of FIG. 4), an exterior member 1004 (e.g., the third exterior member 230 of FIG. 4), a porous member 1005, a first flexible member 1006 (e.g., the first flexible member 429 of FIG. 4), a second flexible member 1007 (e.g., the second flexible member 800 of FIG. 8), a first coupling member 1008, a second coupling member 1009, a third coupling member 1010, a fourth coupling member 1011, a microphone 1012 (e.g., the microphone 411, 412, 413, 414, 415, 416, 417, or 418 of FIG. 5), or a cover member 1013 (e.g., the fourth exterior member 240 of FIG. 4).

According to an embodiment, the printed-circuit board 1001 may be disposed between the first support member 1002 and the second support member 1003. The microphone 1012 may be disposed on a second surface 1001b (e.g., the second surface 901b of FIG. 9) of the printed-circuit board 1001. According to an embodiment, the printed-circuit board 1001 may include a through-hole 1001c (e.g., the multiple through-holes 401, 402, 403, 404, 405, 406, 407, and 408 of FIG. 4), and external sound may be introduced into the microphone 1012 through the through-hole 1001c.

According to an embodiment, the first support member 1002 (e.g., the first support member 902 of FIG. 9) may press the printed-circuit board 1001 toward the second support member 1003. The first flexible member 1006 may be disposed between the first support member 1002 and the printed-circuit board 1001, and may be supported by the first support member 1002, so as to elastically press the printed-circuit board 1001. According to an embodiment, the first support member 1002 may include a recess 1002a (e.g., the recess 421, 422, 423, 424, 425, 426, 427, or 428 of FIG. 6) for allowing the microphone 1012, which has a height protruding from the second surface 1001b of the printed-circuit board 1001, to be inserted thereinto.

According to an embodiment, the second support member 1003 may be disposed between the exterior member 1004 and the printed-circuit board 1001, and may include a through-hole 1003a (e.g., the through-hole 431, 432, 433, 434, 435, 436, 437, or 438 of FIG. 7A or FIG. 7B) aligned with the through-hole 1001c in the printed-circuit board 1001.

According to an embodiment, the second support member 1003 may include a recess 1003b (e.g., the recess 431a, 432a, 433a, 434a, 435a, 436a, 437a, or 438a of FIG. 7B) formed in a surface facing the printed-circuit board 1001, and extending to (or overlapping) the through-hole 1003a. According to an embodiment, the second flexible member 1007 may be disposed in the recess 1003b, and may elastically press the printed-circuit board 1001. The second flexible member 1007 may include a through-hole 1007a aligned with the through-hole 1001c in the printed-circuit board 1001 or the through-hole 1003a in the second support member 1003.

According to an embodiment, an edge area (not shown) of the porous member 1005 may be disposed in the recess 1003b, and may be coupled to the second support member 1003 and/or the second flexible member 1007 by means of the first coupling member 1008 and/or the second coupling member 1009. An inner area (not shown) of the porous member 1005 may be disposed between the through-hole 1003a in the second support member 1003 and the through-hole 1001c in the printed-circuit board 1001, so as to prevent foreign materials from being introduced into the through-hole 1001c in the printed-circuit board 1001.

According to an embodiment, the first coupling member 1008 may be disposed between the second flexible member 1007 and the porous member 1005, and may include various adhesive or viscous materials (e.g., double-sided tape).

According to an embodiment, the second coupling member 1009 may be disposed between the porous member 1005 and a surface of the recess 1003b, facing the porous member 1005, and may include various adhesive or viscous materials (e.g., double-sided tape).

According to an embodiment, the third coupling member 1010 may be disposed between the second flexible member 1007 and a surface of the recess 1003b, facing the second flexible member 1007, and may include various adhesive or viscous materials. The third coupling member 1010 may be disposed in the recess 1003b to laterally surround the porous member 1005.

According to an embodiment, the fourth coupling member 1011 may be disposed between the exterior member 1004 and the second support member 1003, and may include various adhesive or viscous materials (e.g., double-sided tape). The fourth coupling member 1011 may be disposed along an area in a rear surface 1004b of the exterior member 1004, wherein the rear surface 1004b faces the second support member 1003, and the area is adjacent to the through-hole 1004a (e.g., the through-hole 904a of FIG. 9) in the exterior member 1004.

According to an embodiment, the exterior member 1004 may include a recess 1004c (e.g., the recess 230c of FIG. 4) formed in a surface facing a direction opposite the direction faced by the rear surface 1004b thereof, and extending to (or overlapping) the through-hole 1004a. The cover member 1013 (e.g., the cover member 912 of FIG. 9) may be disposed in the recess 1004c so as to cover the through-hole 1004a in the exterior member 1004.

According to an embodiment, a path which has a structure in which external sound moves to the microphone 1012 may include the through-hole 1001c in the printed-circuit board 1001, the through-hole 1003a in the second support member 1003, and the through-hole 1004a in the exterior member 1004, which are aligned with the microphone 1012. According to an embodiment, the second flexible member 1007, the first coupling member 1008, the second coupling member 1009, and the third coupling member 1010 arranged between the printed-circuit board 1001 and the second support member 1003 may prevent sound from escaping between the printed-circuit board 1001 and the second support member 1003 in the path. According to an embodiment, the fourth coupling member 1011 disposed between the exterior member 1004 and the second support member 1003 may prevent sound from escaping between the exterior member 1004 and the second support member 1003 in the path.

According to an embodiment, sound may move between the first coupling member 1008 and the second coupling member 1009 through a gap in the porous member 1005, but it may be difficult for the sound to escape between the printed-circuit board 1001 and the second support member 1003 because of the coupling between the second flexible member 1007, the second support member 1003, and the third coupling member 1010.

According to an embodiment, a path to the microphone 1012 and a sound escapement prevention structure, as shown in FIG. 10, may be applied to multiple microphones, whereby the performance of accuracy of voice recognition or direction recognition can be secured by means of the multiple microphones.

Figure 11:
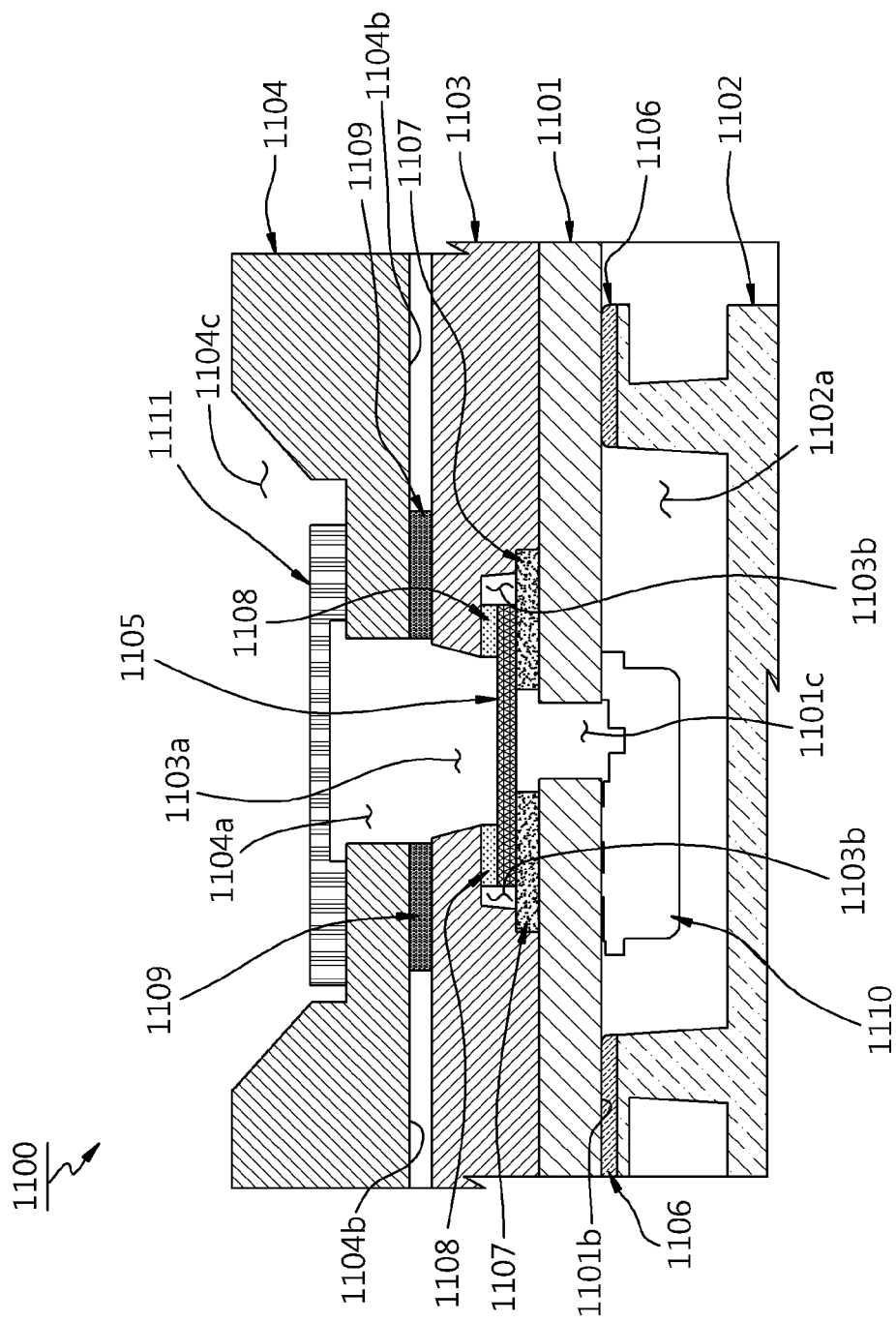
FIG. 11 is a cross-sectional view of an electronic device according to various embodiments.

FIG. 11 is a cross-sectional view of an electronic device according to various embodiments.

Referring to FIG. 11, an electronic device 1100 (e.g., the electronic device 400 of FIG. 4) may include at least one of a printed-circuit board 1101 (e.g., the first printed-circuit board 410 of FIG. 4), a first support member 1102 (e.g., the first support member 420 of FIG. 4), a second support member 1103 (e.g., the second support member 430 of FIG. 4), an exterior member 1104 (e.g., the third exterior member 230 of FIG. 4), a porous member 1105, a flexible member 1106 (e.g., the first flexible member 429 of FIG. 4), a first coupling member 1107, a second coupling member 1108, a third coupling member 1109, a microphone 1110 (e.g., the microphone 411, 412, 413, 414, 415, 416, 417, or 418 of FIG. 5), or a cover member 1111 (e.g., the fourth exterior member 240 of FIG. 4).

According to an embodiment, the printed-circuit board 1101 may be disposed between the first support member 1102 and the second support member 1103. The microphone 1110 may be disposed on a second surface 1101b (e.g., the second surface 901b of FIG. 9) of the printed-circuit board 1101. According to an embodiment, the printed-circuit board 1101 may include a through-hole 1101c (e.g., the multiple through-holes 401, 402, 403, 404, 405, 406, 407, and 408 of FIG. 4), and external sound may be introduced into the microphone 1110 through the through-hole 1101c.

According to an embodiment, the first support member 1102 (e.g., the first support member 902 of FIG. 9) may press the printed-circuit board 1101 toward the second support member 1103. The first flexible member 1106 may be disposed between the first support member 1102 and the printed-circuit board 1101, and may be supported by the first support member 1102, so as to elastically press the printed-circuit board 1101. According to an embodiment, the first support member 1102 may include a recess 1102a (e.g., the recess 421, 422, 423, 424, 425, 426, 427, or 428 of FIG. 6) for allowing the microphone 1110, which has a height protruding from the second surface 1101b of the printed-circuit board 1101, to be inserted thereinto.

According to an embodiment, the second support member 1103 may be disposed between the exterior member 1104 and the printed-circuit board 1101, and may include a through-hole 1103a (e.g., the through-hole 431, 432, 433, 434, 435, 436, 437, or 438 of FIG. 7A or FIG. 7B) aligned with the through-hole 1101c in the printed-circuit board 1101.

According to an embodiment, the second support member 1103 may include a recess 1103b (e.g., the recess 431a, 432a, 433a, 434a, 435a, 436a, 437a, or 438a of FIG. 7B) formed in a surface facing the printed-circuit board 1101, and extending to (or overlapping) the through-hole 1103a. According to an embodiment, an edge area (not shown) of the porous member 1105 may be disposed in the recess 1103b, and may be coupled to the second support member 1103 by means of the first coupling member 1107 and/or the second coupling member 1108. An inner area (not shown) of the porous member 1105 may be disposed between the through-hole 1103a in the second support member 1103 and the through-hole 1101c in the printed-circuit board 1101 so as to prevent foreign materials from being introduced into the through-hole 1101c in the printed-circuit board 1101.

According to an embodiment, the first coupling member 1107 may be disposed between the porous member 1105 and the printed-circuit board 1101, and may include various adhesive or viscous materials (e.g., double-sided tape). According to an embodiment, the first coupling member 1107 may extend to a gap between the second support member 1103 and the printed-circuit board 1101, as well as a gap between the porous member 1105 and the printed-circuit board 1101.

According to an embodiment, the second coupling member 1108 may be disposed between the porous member 1105 and a surface of the recess 1103b, facing the porous member 1105, and may include various adhesive or viscous materials.

According to an embodiment, the third coupling member 1109 may be disposed between the exterior member 1104 and the second support member 1103, and may include various adhesive or viscous materials (e.g., double-sided tape). The third coupling member 1109 may be disposed along an area in a rear surface 1104b of the exterior member 1104, wherein the area is adjacent to the through-hole 1104a (e.g., the through-hole 904a of FIG. 9) in the exterior member 1104, and the rear surface 1104b faces the second support member 1103.

According to an embodiment, the exterior member 1104 may include a recess 1104c (e.g., the recess 230c of FIG. 4) formed in a surface facing a direction opposite the direction faced by the rear surface 1104b thereof, and extending to (or overlapping) the through-hole 1104a. The cover member 1111 (e.g., the cover member 912 of FIG. 9) may be disposed in the recess 1104c so as to cover the through-hole 1104a in the exterior member 1104.

According to an embodiment, a path which has a structure in which external sound moves to the microphone 1110 may include the through-hole 1101c in the printed-circuit board 1101, the through-hole 1103a in the second support member 1103, and the through-hole 1104a in the exterior member 1104, which are aligned with the microphone 1110. According to an embodiment, the first coupling member 1107 and the second coupling member 1108 arranged between the printed-circuit board 1101 and the second support member 1103 may prevent sound from escaping between the printed-circuit board 1101 and the second support member 1103 in the path. According to an embodiment, the third coupling member 1109 disposed between the exterior member 1104 and the second support member 1103 may prevent sound from escaping through a gap formed between the exterior member 1104 and the second support member 1103 in the path.

According to an embodiment, sound may move between the first coupling member 1107 and the second coupling member 1108 through a gap in the porous member 1105, but it may be difficult for the sound to escape between the printed-circuit board 1101 and the second support member 1103, because of the coupling between the first coupling member 1107 and the printed-circuit board 1101.

According to an embodiment, a path to the microphone 1110 and a sound escapement prevention structure, as shown in FIG. 11, may be applied to multiple microphones, whereby the performance of accuracy of voice recognition or direction recognition can be secured by means of the multiple microphones.

Figure 12:
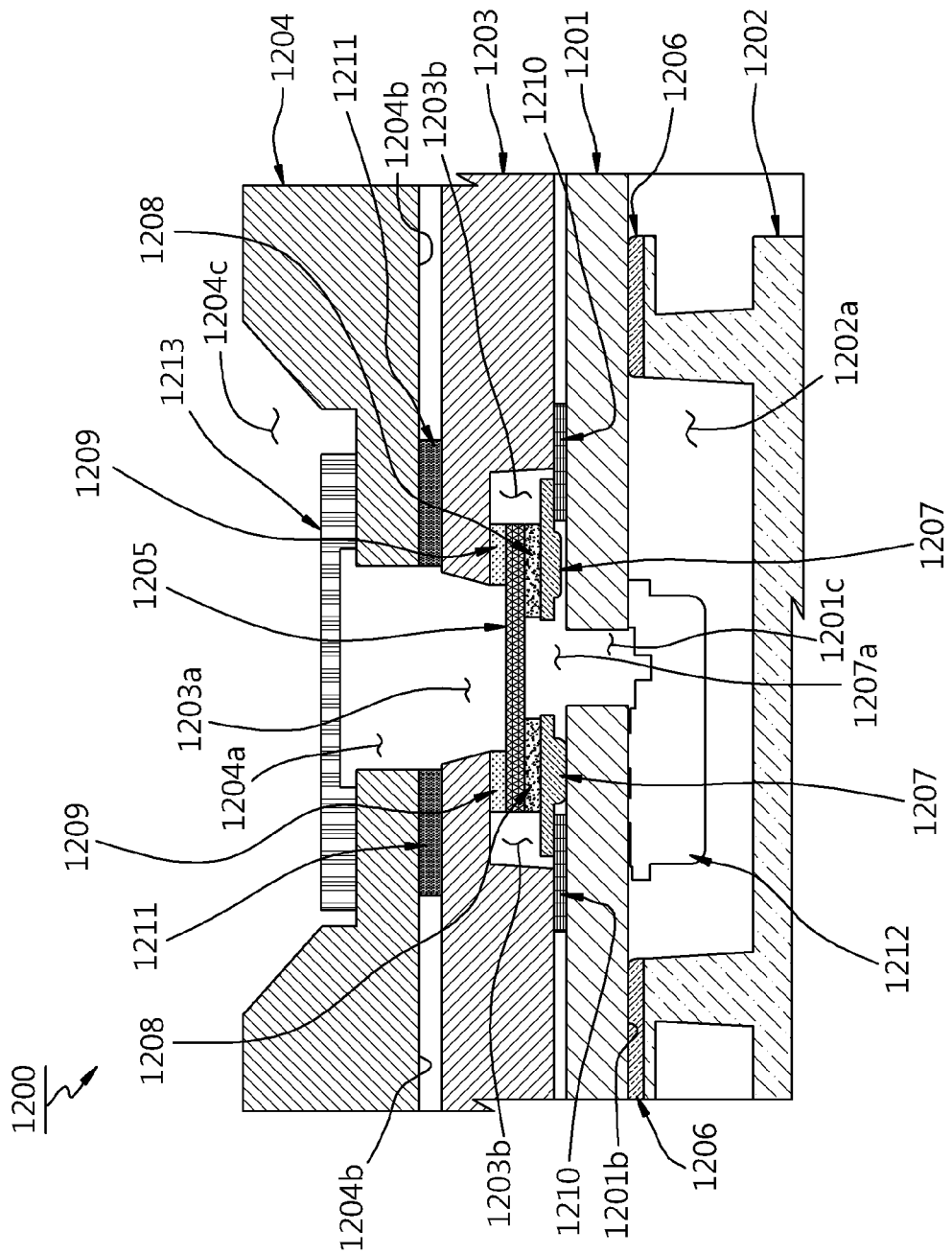
FIG. 12 is a cross-sectional view of an electronic device according to various embodiments.

FIG. 12 is a cross-sectional view of an electronic device according to various embodiments.

Referring to FIG. 12, an electronic device 1200 (e.g., the electronic device 400 of FIG. 4) may include at least one of a printed-circuit board 1201 (e.g., the first printed-circuit board 410 of FIG. 4), a first support member 1202 (e.g., the first support member 420 of FIG. 4), a second support member 1203 (e.g., the second support member 430 of FIG. 4), an exterior member 1204 (e.g., the third exterior member 230 of FIG. 4), a porous member 1205, a first flexible member 1206 (e.g., the first flexible member 429 of FIG. 4), a second flexible member 1207 (e.g., the second flexible member 800 of FIG. 8), a first coupling member 1208, a second coupling member 1209, a third coupling member 1210, a fourth coupling member 1211, a microphone 1212 (e.g., the microphone 411, 412, 413, 414, 415, 416, 417, or 418 of FIG. 5), or a cover member 1213 (e.g., the fourth exterior member 240 of FIG. 4).

According to an embodiment, the printed-circuit board 1201 may be disposed between the first support member 1202 and the second support member 1203. The microphone 1212 may be disposed on a second surface 1201b of the printed-circuit board 1201 (e.g., the second surface 901b of FIG. 9). According to an embodiment, the printed-circuit board 1201 may include a through-hole 1201c (e.g., the multiple through-holes 401, 402, 403, 404, 405, 406, 407, and 408 of FIG. 4), and external sound may be introduced into the microphone 1212 through the through-hole 1201c.

According to an embodiment, the first support member 1202 (e.g., the first support member 902 of FIG. 9) may press the printed-circuit board 1201 toward the second support member 1203. The first flexible member 1206 may be disposed between the first support member 1202 and the printed-circuit board 1201, and may be supported by the first support member 1202, so as to elastically press the printed-circuit board 1201. According to an embodiment, the first support member 1202 may include a recess 1202a (e.g., the recess 421, 422, 423, 424, 425, 426, 427, or 428 of FIG. 6) for allowing the microphone 1212, which has a height protruding from the second surface 1201b of the printed-circuit board 1201, to be inserted thereinto.

According to an embodiment, the second support member 1203 may be disposed between the exterior member 1204 and the printed-circuit board 1201, and may include a through-hole 1203a (e.g., the through-hole 431, 432, 433, 434, 435, 436, 437, or 438 of FIG. 7A or FIG. 7B) aligned with the through-hole 1201c in the printed-circuit board 1201.

According to an embodiment, the second support member 1203 may include a recess 1203b (e.g., the recess 431a, 432a, 433a, 434a, 435a, 436a, 437a, or 438a of FIG. 7B) formed in a surface facing the printed-circuit board 1201, and extending to (or overlapping) the through-hole 1203a. According to an embodiment, the second flexible member 1207 may be disposed in the recess 1203b, and may elastically press the printed-circuit board 1201. The second flexible member 1207 may include a through-hole 1207a aligned with the through-hole 1201c in the printed-circuit board 1201 or the through-hole 1203a in the second support member 1203.

According to an embodiment, an edge area (not shown) of the porous member 1205 may be disposed in the recess 1203b, and may be coupled to the second support member 1203 by means of the first coupling member 1208 and/or the second coupling member 1209. An inner area (not shown) of the porous member 1205 may be disposed between the through-hole 1203a in the second support member 1203 and the through-hole 1201c in the printed-circuit board 1201 so as to prevent foreign materials from being introduced into the through-hole 1201c in the printed-circuit board 1201.

According to an embodiment, the first coupling member 1208 may be disposed between the second flexible member 1207 and the porous member 1205, and may include various adhesive or viscous materials (e.g., double-sided tape).

According to an embodiment, the second coupling member 1209 may be disposed between the porous member 1205 and a surface of the recess 1203b, facing the porous member 1205, and may include various adhesive or viscous materials (e.g., double-sided tape).

According to an embodiment, the third coupling member 1210 may be disposed between the second support member 1203 and the printed-circuit board 1201. According to various embodiments, as shown in FIG. 12, the third coupling member 1210 may extend to a gap between the second flexible member 1207 and the printed-circuit board 1201.

According to an embodiment, the fourth coupling member 1211 may be disposed between the exterior member 1204 and the second support member 1203, and may include various adhesive or viscous materials (e.g., double-sided tape). The fourth coupling member 1211 may be disposed along an area in a rear surface 1204b of the exterior member 1204, wherein the area is adjacent to the through-hole 1204a (e.g., the through-hole 904a of FIG. 9) in the exterior member 1204, and the rear surface 1204b faces the second support member 1203.

According to an embodiment, the exterior member 1204 may include a recess 1204c (e.g., the recess 230c of FIG. 4) formed in a surface facing a direction opposite the direction faced by the rear surface 1204b thereof, and extending to (or overlapping) the through-hole 1204a. The cover member 1213 (e.g., the cover member 912 of FIG. 9) may be disposed in the recess 1204c so as to cover the through-hole 1204a in the exterior member 1204.

According to an embodiment, a path which has a structure in which external sound moves to the microphone 1212 may include the through-hole 1201c in the printed-circuit board 1201, the through-hole 1203a in the second support member 1203, and the through-hole 1204a in the exterior member 1204, which are aligned with the microphone 1212. According to an embodiment, the second flexible member 1207, the first coupling member 1208, the second coupling member 1209, and the third coupling member 1210, which are arranged between the printed-circuit board 1201 and the second support member 1203, may prevent sound from escaping between the printed-circuit board 1201 and the second support member 1203 in the path. According to an embodiment, the fourth coupling member 1211 disposed between the exterior member 1204 and the second support member 1203 may prevent sound from escaping between the exterior member 1204 and the second support member 1203 in the path.

According to an embodiment, sound may move between the first coupling member 1208 and the second coupling member 1209 through a gap in the porous member 1205, but it may be difficult for the sound to escape between the printed-circuit board 1201 and the second support member 1203 because of the coupling between the second support member 1203, the printed-circuit board 1201, and the third coupling member 1210.

According to an embodiment, a path to the microphone 1212 and a sound escapement prevention structure, as shown in FIG. 12, may be applied to multiple microphones, whereby the performance of accuracy of voice recognition or direction recognition can be secured by means of the multiple microphones.

Figure 13:
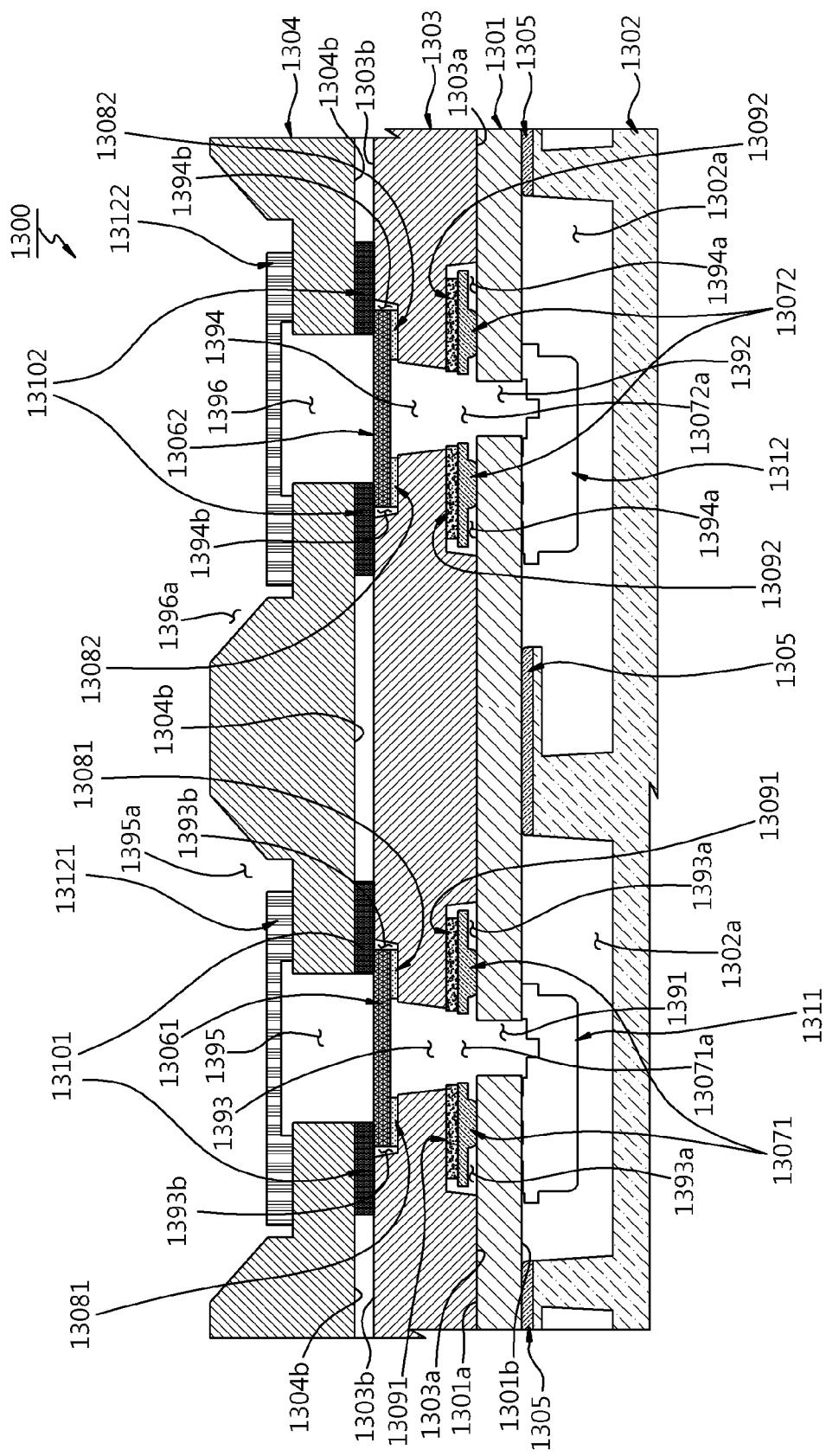
FIG. 13 is a cross-sectional view of an electronic device according to an embodiment.

FIG. 13 is a cross-sectional view of an electronic device according to an embodiment.

Referring to FIG. 13, an electronic device 1300 (e.g., the electronic device 400 of FIG. 4) may include at least one of a printed-circuit board 1301 (e.g., the first printed-circuit board 410 of FIG. 4, or the printed-circuit board 901 of FIG. 9), a first support member 1302 (e.g., the first support member 420 of FIG. 4, or the first support member 902 of FIG. 9), a second support member 1303 (e.g., the second support member 430 of FIG. 4, or the second support member 903 of FIG. 9), an exterior member 1304 (e.g., the third exterior member 230 of FIG. 4, or the exterior member 904 of FIG. 9), a flexible member 1305 (e.g., the first flexible member 429 of FIG. 4, or the first flexible member 906 of FIG. 9), a first sound-permeable member 13061, a second sound-permeable member 13062, a first sealing member 13071, a second sealing member 13072, a first adhesive member 13081, a second adhesive member 13082, a third adhesive member 13091, a fourth adhesive member 13092, a fifth adhesive member 13101, a sixth adhesive member 13102, a first microphone 1311, a second microphone 1312, a first cover member 13121, or a second cover member 13122.

According to an embodiment, the electronic device 1300 may include a housing (not shown) (e.g., the housing 201 of FIG. 2) forming an exterior of the electronic device 1300, and the cover member 1304 may form a portion of the housing.

According to an embodiment, the printed-circuit board 1301 may be disposed between the first support member 1302 and the second support member 1303. The printed-circuit board 1301 may include a first surface 1301a (e.g., the first surface 410a of FIG. 4), and a second surface 1301b (e.g., the second surface 410b of FIG. 5) facing a direction opposite the direction faced by the first surface 1301a. The first microphone 1311 and the second microphone 1312 may be arranged on the second surface 1301b of the printed-circuit board 1301, and may be spaced apart from each other. For example, the first microphone 1311 or the second microphone 1312 may be the microphone 911 of FIG. 9.

According to an embodiment, the printed-circuit board 1301 may include a first through-hole 1391 and a second through-hole 1392, each of which extends through the first surface 1301a and the second surface 1301b. For example, the first through-hole 1391 or the second through-hole 1392 may include the through-hole 901c of FIG. 9. When seen from above the first surface 1301a, the first microphone 1311 may at least partially overlap the first through-hole 1391, and the second microphone 1312 may at least partially overlap the second through-hole 1392. External sound may be introduced into the first microphone 1311 through the first through-hole 1391, and may be introduced into the second microphone 1312 through the second through-hole 1392.

According to an embodiment, the first support member 1302 may press the printed-circuit board 1301 toward the second support member 1303. The flexible member 1305 may be disposed between the first support member 1302 and the printed-circuit board 1301, and may be supported by the first support member 1302, so as to elastically press the printed-circuit board 1301 toward the second support member 1303. According to an embodiment, the first support member 1302 may include a recess 1302a (e.g., the recess 421, 422, 423, 424, 425, 426, 427, or 428 of FIG. 6, or the recess 902*a* of FIG. 9) for allowing the first and the second microphone 1311 and 1312, each of which has a height protruding from the second surface 1301*b* of the printed-circuit board 1301, to be inserted thereinto.

According to an embodiment, the second support member 1303 may be disposed between the exterior member 1304 and the printed-circuit board 1301. When seen from above the first surface 1301*a*, the second support member 1303 may include a third through-hole 1393 at least partially overlapping the first through-hole 1391 of the printed-circuit board 1301 and the fourth through-hole 1394 at least partially overlapping the second through-hole 1392. For example, the third through-hole 1393 or the fourth through-hole 1394 may be the through-hole 903*a* of FIG. 9.

According to an embodiment, the second support member 1303 may include a third surface 1303*a* facing the first surface 1301*a* of the printed-circuit board 1301, and a fourth surface 1303*b* facing a direction opposite the direction faced by the third surface 1303*a*. According to an embodiment, the second support member 1303 may include a third recess 1393*a* formed in the third surface 1303*a* and extending to (or overlapping) the third through-hole 1393, and/or a fourth recess 1394*a* formed in the third surface 1303*a* and extending to (or overlapping) the fourth through-hole 1394. For example, the third recess 1393*a* or the fourth recess 1394*a* may be the recess 903*b* of FIG. 9.

According to an embodiment, the first sealing member 13071 may be disposed in the third recess 1393*a*, and the second sealing member 13072 may be disposed in the fourth recess 1394*a*. For example, the first sealing member 13071 or the second sealing member 13072 may include the second flexible member 800 of FIG. 8 and the second flexible member 907 of FIG. 9. The first sealing member 13071 and the second sealing member 13072 may elastically press the printed-circuit board 1301. The first sealing member 13071 may include a through-hole 13071*a* aligned with the first through-hole 1391 in the printed-circuit board 1301 or the third through-hole 1393 in second support member 1303. The second sealing member 13072 may include a through-hole 13072*a* aligned with the second through-hole 1392 in the printed-circuit board 1301 or the fourth through-hole 1394 in the second support member 1303.

According to an embodiment, the third adhesive member 13091 may be disposed between the first sealing member 13071 and a surface of the third recess 1393*a*, facing the first sealing member 13071, and may include various adhesive or viscous materials (e.g., double-sided tape). The fourth adhesive member 13092 may be disposed between the second sealing member 13072 and a surface of the fourth recess 1394*a*, facing the second sealing member 13072, and may include various adhesive or viscous materials (e.g., double-sided tape). For example, the third adhesive member 13091 or the fourth adhesive member 13092 may be the first coupling member 908 of FIG. 9.

According to an embodiment, the first sound-permeable member 13061 may be disposed on the fourth surface 1303*b*, and may at least partially overlap the third through-hole 1393. The second sound-permeable member 13062 may be disposed on the fourth surface 1303*b*, and may at least partially overlap the fourth through-hole 1394. For example, the first sound-permeable member 13061 or the second sound-permeable member 13062 may be the porous member 905 of FIG. 9.

According to an embodiment, the second support member 1303 may include a first recess 1393*b* formed in the fourth surface 1303*b* facing the exterior member 1304, and extending to (or overlapping) the third through-hole 1393. According to an embodiment, an edge area (not shown) of the first sound-permeable member 13061 may be disposed in the first recess 1393*b*, and may be coupled to the second support member 1303 by means of the first adhesive member 13081. The first adhesive member 13081 may be disposed between the first sound-permeable member 13061 and a surface of the first recess 1393*b*, facing the first sound-permeable member 13061, and may include various adhesive or viscous materials (e.g., double-sided tape). An inner area (not shown) of the first sound-permeable member 13061 may cover the third through-hole 1393 in the second support member 1303, so as to prevent materials from being introduced into the third through-hole 1393.

According to an embodiment, the second support member 1303 may include a second recess 1394*b* formed in the fourth surface 1303*b*, and extending to (or overlapping) the fourth through-hole 1394. According to an embodiment, an edge area (not shown) of the second sound-permeable member 13062 may be disposed in the second recess 1394*b*, and may be coupled to the second support member 1303 by means of the second adhesive member 13082. The second adhesive member 13082 may be disposed between the second sound-permeable member 13062 and a surface of the second recess 1394*b*, facing the second sound-permeable member 13062, and may include various adhesive or viscous materials (e.g., double-sided tape). An inner area (not shown) of the second sound-permeable member 13062 may cover the fourth through-hole 1394 in the second support member 1303 so as to prevent foreign materials such as dust from being introduced into the fourth through-hole 1394.

The first adhesive member 13081 or the second adhesive member 13082 may be, for example, the second adhesive member 909 of FIG. 9.

According to an embodiment, when seen from above the first surface 1301*a*, the exterior member 1304 may include a fifth through-hole 1395 at least partially overlapping the third through-hole 1393 in the second support member 1303, and a sixth through-hole 1396 at least partially overlapping the fourth through-hole 1394 in the second support member 1303.

According to an embodiment, the fifth adhesive member 13101 and the sixth adhesive member 13102 may be arranged between the exterior member 1304 and the second support member 1303, and may include various adhesive or viscous materials (e.g., double-sided tape). The fifth adhesive member 13101 may be disposed along an area in a rear surface 1304*b* of the exterior member 1304, wherein the area is adjacent to the fifth through-hole 1395, and the rear surface 1304*b* faces the second support member 1303. The sixth adhesive member 13102 may be disposed along an area in the rear surface 1304*b* of the exterior member 1304, wherein the area is adjacent to the sixth through-hole 1396. For example, the fifth adhesive member 13101 or the sixth adhesive member 13102 may be the third coupling member 910 of FIG. 9. The fifth adhesive member 13101 may cover a portion of the first sound-permeable member 13061, the portion being disposed in the first recess 1393*b* in the second support member 1303. The sixth adhesive member 13102 may cover a portion of the second sound-permeable member 13062, the portion being disposed in the second recess 1394*b* in the second support member 1303.

According to various embodiments, the first sound-permeable member 13061 may have a thickness sufficient to reach the fifth adhesive member 13101, and may be coupled to the fifth adhesive member 13101. The second sound-permeable member 13062 may have a thickness sufficient to reach the sixth adhesive member 13102, and may be coupled to the sixth adhesive member 13102.

According to an embodiment, the exterior member 1304 may include a fifth recess 1395a and/or a sixth recess 1396a which are formed in a surface (not shown) facing a direction opposite the direction faced by the direction faced by the rear surface 1304b of the exterior member 1304 and extend to (or overlap) the fifth through-hole 1395 and/or the sixth through-hole 1396, respectively. The first cover member 13121 may be disposed in the fifth recess 1395a so as to cover the fifth through-hole 1395 in the exterior member 1304. The second cover member 13122 may be disposed in the sixth recess 1396a so as to cover the sixth through-hole 1396 in the exterior member 1304. The first and the second cover member 13121 and 13122 may cover the fifth and the sixth through-holes 1395 and 1396 in the exterior member 1304 so as to enhance the aesthetics of the electronic device 1300, and may include multiple through-holes for allowing sound to pass therethrough. For example, the first cover member 13121 or the second cover member 13122 may be the cover member 912 of FIG. 9. According to an embodiment, the first and the second cover member 13121 and 13122 may be formed as an integral member (e.g., the fourth exterior member 240 of FIG. 4).

According to an embodiment, a first path which has a structure in which external sound moves to the first microphone 1311 may include the first through-hole 1391 in the printed-circuit board 1301, the third through-hole 1393 in the second support member 1303, and/or the fifth through-hole 1395 in the exterior member 1304, which are aligned with the first microphone 1311. According to an embodiment, the first sealing member 13071 and the third adhesive member 13091 arranged between the printed-circuit board 1301 and the second support member 1303 may prevent sound from escaping between the printed-circuit board 1301 and the second support member 1303 in the first path. According to an embodiment, the fifth adhesive member 13101 disposed between the exterior member 1304 and the second support member 1303 may prevent sound from escaping between the exterior member 1304 and the second support member 1303 in the first path.

According to an embodiment, a second path which has a structure in which external sound moves to the second microphone 1312, may include the second through-hole 1392 in the printed-circuit board 1301, the fourth through-hole 1394 in the second support member 1303, and the sixth through-hole 1396 in the exterior member 1304, which are aligned with the second microphone 1312. According to an embodiment, the second sealing member 13072 and the fourth adhesive member 13092, arranged between the printed-circuit board 1301 and the second support member 1303, may prevent sound from escaping between the printed-circuit board 1301 and the second support member 1303 in the second path. According to an embodiment, the sixth adhesive member 13102 disposed between the exterior member 1304 and the second support member 1303 may prevent sound from escaping between the exterior member 1304 and the second support member 1303 in the second path.

According to various embodiments, the electronic device 1300 may further include a seventh adhesive member (not shown) disposed between the second support member 1303 and the printed-circuit board 1301 around the third recess 1393a or the fourth recess 1394a. According to various embodiments, as exemplified by the third coupling member 1210 of FIG. 12, the seventh adhesive member may extend to a gap between the printed-circuit board 1301 and a portion of the first sealing member 13071 and/or the second sealing member 13072.

According to an embodiment, the first path and the second path may be implemented to have a structure for preventing sound from escaping, as shown in FIG. 13, whereby the performance of accuracy of voice recognition or direction recognition can be secured by using the first microphone 1311 and the second microphone 1312.

According to an embodiment of the disclosure, an electronic device (e.g., 1300 of FIG. 13) may include: a housing (e.g., the housing 201 of FIG. 2); and a printed-circuit board (e.g., the printed-circuit board 1301 of FIG. 13), which is disposed in the housing and includes a first surface (e.g., the first surface 1301a of FIG. 13), a second surface (e.g., the second surface 1301b of FIG. 13) facing a direction opposite the direction faced by the first surface, and a first through-hole (e.g., the first through-hole 1391 of FIG. 13) and a second through-hole (e.g., the second through-hole 1392 of FIG. 13), each of which extends through the first surface and the second surface. The electronic device may include: a first microphone (e.g., the first microphone 1311 of FIG. 13), which is disposed on the second surface and at least partially overlaps the first through-hole when seen from above the first surface; and a second microphone (e.g., the second microphone 1312 of FIG. 13), which is disposed on the second surface and at least partially overlaps the second through-hole when seen from above the first surface. The electronic device may include a support member (e.g., the second support member 1303 of FIG. 13), which is disposed on the first surface and includes a third surface (e.g., the third surface 1303a of FIG. 13) facing the first surface, and a fourth surface (e.g., the fourth surface 1303b of FIG. 13) facing a direction opposite the direction faced by the third surface. The support member may include: a third through-hole (e.g., the third through-hole 1393 of FIG. 13) at least partially overlapping the first through-hole when seen from above the first surface; and a fourth through-hole (e.g., the fourth through-hole 1394 of FIG. 13) at least partially overlapping the second through-hole when seen from above the first surface. The electronic device may include: a first sound-permeable member (e.g., the first sound-permeable member 13061 of FIG. 13), which is disposed on the fourth surface and at least partially overlaps the third through-hole; and a second sound-permeable member (e.g., the second sound-permeable member 13062 of FIG. 13), which is disposed on the fourth surface and at least partially overlaps the fourth through-hole.

According to an embodiment of the disclosure, the electronic device (e.g., the electronic device 1300 of FIG. 13) may further include: a first adhesive member (e.g., the first adhesive member 13081 of FIG. 13) disposed between the first sound-permeable member (e.g., the first sound-permeable member 13061 of FIG. 13) and the fourth surface (e.g., the fourth surface 1303b of FIG. 13); and a second adhesive member (e.g., the second adhesive member 13082 of FIG. 13) disposed between the second sound-permeable member (e.g., the second sound-permeable member 13062 of FIG. 13) and the fourth surface.

According to an embodiment of the disclosure, the support member (e.g., the second support member 1303 of FIG. 13) may further include: a first recess (e.g., the first recess 1393b of FIG. 13) overlapping the third through-hole (e.g., the third through-hole 1393 of FIG. 13) in the fourth surface (e.g., the fourth surface 1303b of FIG. 13); and a second recess (e.g., the second recess 1394b of FIG. 13) overlapping the fourth through-hole (e.g., the fourth through-hole 1394 of FIG. 13) in the fourth surface. The first sound-permeable member (e.g., the first sound-permeable member 13061 of FIG. 13) may be disposed in the first recess, and the second sound-permeable member (e.g., the second sound-permeable member 13062 of FIG. 13) may be disposed in the second recess.

According to an embodiment of the disclosure, the electronic device (e.g., the electronic device 1300 of FIG. 13) may further include a sealing member (e.g., the first sealing member 13071 or the second sealing member 13072 of FIG. 13) disposed between the first surface (e.g., the first surface 1301a of FIG. 13) and the third surface (e.g., the third surface 1303a of FIG. 13).

According to an embodiment of the disclosure, the electronic device (e.g., the electronic device 1300 of FIG. 13) may further include a third adhesive member (e.g., the third adhesive member 13091 or the fourth adhesive member 13092 of FIG. 13) disposed between the sealing member (e.g., the first sealing member 13071 or the second sealing member 13072 of FIG. 13) and the third surface (e.g., the third surface 1303a of FIG. 13).

According to an embodiment of the disclosure, the sealing member may include: a first sealing member (e.g., the first sealing member 13071 of FIG. 13) including a through-hole (e.g., the through-hole 13071a of FIG. 13) aligned with the first through-hole (e.g., the first through-hole 1391 of FIG. 13) and the third through-hole (e.g., the third through-hole 1393 of FIG. 13); and a second sealing member (e.g., the second sealing member 13072 of FIG. 13) including a through-hole (e.g., the through-hole 13072a of FIG. 13) aligned with the second through-hole (e.g., the second through-hole 1392 of FIG. 13) and the fourth through-hole (e.g., the fourth through-hole 1394 of FIG. 13).

According to an embodiment of the disclosure, the support member (e.g., the second support member 1303 of FIG. 13) may further include: a third recess (e.g., the third recess 1393a of FIG. 13) overlapping the third through-hole (e.g., the third through-hole 1393 of FIG. 13) in the third surface (e.g., the third surface 1303a of FIG. 13); and a fourth recess (e.g., the fourth recess 1394a of FIG. 13) overlapping the fourth through-hole (e.g., the fourth through-hole 1394 of FIG. 13) in the third surface. The first sealing member (e.g., the first sealing member 13071 of FIG. 13) may be disposed in the third recess, and the second sealing member (e.g., the second sealing member 13072 of FIG. 13) may be disposed in the fourth recess.

According to an embodiment of the disclosure, the electronic device (e.g., the electronic device 1300 of FIG. 13) may further include an adhesive member (e.g., the third adhesive member 1210 of FIG. 12) disposed between the first surface (e.g., the first surface 1301a of FIG. 13) and the third surface (e.g., the third surface 1303a of FIG. 13) around the third recess (e.g., the third recess 1393a of FIG. 13) and/or the fourth recess (e.g., the fourth recess 1394a of FIG. 13).

According to an embodiment of the disclosure, the electronic device (e.g., the electronic device 1300 of FIG. 13) may further include an adhesive member (e.g., the first coupling member 1107 of FIG. 11) disposed between the first surface (e.g., the first surface 1301a of FIG. 13) and the third surface (e.g., the third surface 1393a) around the third through-hole (e.g., the third through-hole 1393 of FIG. 13) and/or the fourth through-hole (e.g., the fourth through-hole 1394 of FIG. 13).

According to an embodiment of the disclosure, the first sound-permeable member (e.g., the first sound-permeable member 13061 of FIG. 13) and/or the second sound-permeable member (e.g., the second sound-permeable member 13062 of FIG. 13) may include a mesh structure.

According to an embodiment of the disclosure, when seen from above the first surface (e.g., the first surface 1301a of FIG. 13), the third through-hole (e.g., the third through-hole 1393 of FIG. 13) may have a width greater than that of the first through-hole (e.g., the first through-hole 1391 of FIG. 13), and the fourth through-hole (e.g., the fourth through-hole 1394 of FIG. 13) may have a width greater than that of the second through-hole (e.g., the second through-hole 1392 of FIG. 13).

According to an embodiment of the disclosure, the third through-hole (e.g., the third through-hole 1393 of FIG. 13) and/or the fourth through-hole (e.g., the fourth through-hole 1394 of FIG. 13) may have a shape which becomes narrower along a direction from the fourth surface (e.g., the fourth surface 1393b of FIG. 13) toward the third surface (e.g., the third surface 1393a of FIG. 13).

According to an embodiment of the disclosure, the electronic device (e.g., the electronic device 1300 of FIG. 13) may further include: a second support member (e.g., the first support member 1302 of FIG. 13) coupled to the printed-circuit board (e.g., the printed-circuit board 1301 of FIG. 13) so as to face the second surface (e.g., the second surface 1301b of FIG. 13); and a flexible member (e.g., the flexible member 1305 of FIG. 13) disposed between the printed-circuit board and the second support member.

According to an embodiment of the disclosure, the housing (e.g., the housing 201 of FIG. 2) may further include an exterior member (e.g., the exterior member 1304 of FIG. 13) which is coupled to the support member (e.g., the second support member 1303 of FIG. 13) so as to face the fourth surface (e.g., the fourth surface 1303b of FIG. 13), and includes a fifth through-hole (e.g., the fifth through-hole 1395 of FIG. 13) at least partially overlapping the third through-hole (e.g., the third through-hole 1393 of FIG. 13), and a sixth through-hole (e.g., the sixth through-hole 1395 of FIG. 13) at least partially overlapping the fourth through-hole (e.g., the fourth through-hole 1394 of FIG. 4).

According to an embodiment of the disclosure, the electronic device (e.g., the electronic device 1300 of FIG. 13) may further include an adhesive member (e.g., the fifth adhesive member 13101 or the sixth adhesive member 13102 of FIG. 13) disposed between the support member (e.g., the second support member 1303 of FIG. 13) and the exterior member (e.g., the exterior member 1304 of FIG. 13).

According to an embodiment of the disclosure, when seen from above the exterior member (e.g., the exterior member 1304 of FIG. 13), the fifth through-hole (e.g., the fifth through-hole 1395 of FIG. 13) may have a width greater than that of the third through-hole (e.g., the third through-hole 1393 of FIG. 13), and the sixth through-hole (e.g., the six through-hole 1396 of FIG. 13) may have a width greater than that of the fourth through-hole (e.g., the fourth through-hole 1394 of FIG. 13).

According to an embodiment of the disclosure, the electronic device (e.g., the electronic device 200 of FIG. 2) may include one or more first speakers (e.g., the multiple speakers 320 of FIG. 3) arranged to face a direction opposite the direction that the first surface (e.g., the first surface 1301a of FIG. 13) faces, and electrically connected to the printed-circuit board (e.g., the printed-circuit board 1301 of FIG. 13).

According to an embodiment of the disclosure, the electronic device (e.g., the electronic device 200 of FIG. 2) may include a second speaker (e.g., the second speaker 330 of FIG. 3) disposed to face a direction opposite the direction that the first surface (e.g., the first surface 1301a of FIG. 13) faces, and electrically connected to the printed-circuit board (e.g., the printed-circuit board 1301 of FIG. 13). The second speaker may output sound having a register different from those of the first speakers.

According to various embodiments of the disclosure, an electronic device (e.g., the electronic device 1300 of FIG. 13) may include: a housing (e.g., the housing 201 of FIG. 2); and a printed-circuit board (e.g., the printed-circuit board 1301 of FIG. 13), which is disposed in the housing and includes a first surface (e.g., the first surface 1301a of FIG. 13), a second surface (e.g., the second surface 1301b of FIG. 13) facing a direction opposite the direction faced by the first surface, and a first through-hole (e.g., the first through-hole 1391 of FIG. 13) and a second through-hole (e.g., the second through-hole 1392 of FIG. 13), each of which extends through the first surface and the second surface. The electronic device may include: a first microphone (e.g., the first microphone 1311 of FIG. 13), which is disposed on the second surface and at least partially overlaps the first through-hole when seen from above the first surface; and a second microphone (e.g., the second microphone 1312 of FIG. 13), which is disposed on the second surface and at least partially overlaps the second through-hole when seen from above the first surface. The electronic device may include a support member (e.g., the second support member 1303 of FIG. 13), which is disposed on the first surface and includes a third surface (e.g., the third surface 1303a of FIG. 13) facing the first surface, and a fourth surface (e.g., the fourth surface 1303b of FIG. 13) facing a direction opposite the direction faced by the third surface. The support member may include: a third through-hole (e.g., the third through-hole 1393 of FIG. 13) at least partially overlapping the first through-hole when seen from above the first surface; and a fourth through-hole (e.g., the fourth through-hole 1394 of FIG. 13) at least partially overlapping the second through-hole when seen from above the first surface. The electronic device may include: a first sound-permeable member (e.g., the first sound-permeable member 13061 of FIG. 13), which is disposed on the fourth surface and at least partially overlaps the third through-hole; and a second sound-permeable member (e.g., the second sound-permeable member 13062 of FIG. 13), which is disposed on the fourth surface and at least partially overlaps the fourth through-hole. The electronic device may further include: a first adhesive member (e.g., the first adhesive member 13081 of FIG. 13) disposed between the first sound-permeable member and the fourth surface; and a second adhesive member (e.g., the second adhesive member 13082 of FIG. 13) disposed between the second sound-permeable member and the fourth surface. The electronic device may include a first sealing member (e.g., the first sealing member 13071 of FIG. 13) which is disposed between the first surface and the third surface, and includes a through-hole (e.g., the through-hole 13071a of FIG. 13) aligned with the first through-hole and the third through-hole. The electronic device may include a second sealing member (e.g., the second sealing member 13072 of FIG. 13), which is disposed between the first surface and the third surface and includes a through-hole (e.g., the through-hole 13072a of FIG. 13) aligned with the second through-hole and the fourth through-hole.

According to an embodiment of the disclosure, the electronic device (e.g., the electronic device 1300 of FIG. 13) may further include: a third adhesive member (e.g., the third adhesive member 13091 of FIG. 13) disposed between the third surface (e.g., the third surface 1303a of FIG. 13) and the first sealing member (e.g., the first sealing member 13071 of FIG. 13); and a fourth adhesive member (e.g., the fourth adhesive member 13092 of FIG. 13) disposed between the third surface and the second sealing member (e.g., the second sealing member 13072 of FIG. 13).

In addition, the various embodiments of the disclosure described and shown in the specification and the drawings have been presented to easily explain the technical contents of the disclosure and help understanding of the disclosure, and are not intended to limit the scope of the disclosure. Therefore, the scope of the disclosure should be construed to include, in addition to the embodiments disclosed herein, all changes and modifications derived on the basis of the technical idea of the disclosure.

The invention claimed is:

1. An electronic device comprising:
a housing;
a printed-circuit board which is disposed in the housing, and comprises a first surface, a second surface facing a direction opposite a direction faced by the first surface, and a plurality of through-holes arranged in a circular shape at regular interval, each of which extends through the first surface and the second surface, wherein the plurality of through-holes comprise at least a first through-hole and a second through-hole;
a first microphone which is disposed on the second surface and at least partially overlaps the first through-hole when seen from above the first surface;
a second microphone which is disposed on the second surface and at least partially overlaps the second through-hole when seen from above the first surface;
a support member which is disposed on the first surface, and comprises a third surface facing the first surface and a fourth surface facing a direction opposite a direction faced by the third surface, the support member comprising a third through-hole at least partially overlapping the first through-hole when seen from above the first surface, and a fourth through-hole at least partially overlapping the second through-hole when seen from above the first surface;
a first sound-permeable member which is disposed on the fourth surface and at least partially overlaps the third through-hole; and
a second sound-permeable member which is disposed on the fourth surface and at least partially overlaps the fourth through-hole.

2. The electronic device of claim 1, further comprising:
a first adhesive member disposed between the first sound-permeable member and the fourth surface; and
a second adhesive member disposed between the second sound-permeable member and the fourth surface.

3. The electronic device of claim 1, wherein the support member further comprises:
a first recess overlapping the third through-hole in the fourth surface; and
a second recess overlapping the fourth through-hole in the fourth surface, and
wherein the first sound-permeable member is disposed in the first recess, and the second sound-permeable member is disposed in the second recess.

4. The electronic device of claim 1, further comprising a sealing member disposed between the first surface and the third surface.

5. The electronic device of claim 4, further comprising a third adhesive member disposed between the sealing member and the third surface.

6. The electronic device of claim 4, wherein the sealing member comprises:
- a first sealing member comprising a through-hole aligned with the first through-hole and the third through-hole; and
- a second sealing member comprising a through-hole aligned with the second through-hole and the fourth through-hole.

7. The electronic device of claim 6, wherein the support member further comprises:
- a third recess overlapping the third through-hole in the third surface; and
- a fourth recess overlapping the fourth through-hole in the third surface, and
- wherein the first sealing member is disposed in the third recess, and the second sealing member is disposed in the fourth recess.

8. The electronic device of claim 7, further comprising an adhesive member disposed between the first surface and the third surface around the third recess and/or the fourth recess.

9. The electronic device of claim 1, further comprising an adhesive member disposed between the first surface and the third surface around the third through-hole and/or the fourth through-hole.

10. The electronic device of claim 1, wherein the first sound-permeable member and/or the second sound-permeable member comprises a mesh structure.

11. The electronic device of claim 1, wherein, when seen from above the first surface, the third through-hole has a width greater than a width of the first through-hole, and the fourth through-hole has a width greater than a width of the second through-hole.

12. The electronic device of claim 1, wherein the third through-hole and/or the fourth through-hole has a shape which becomes narrower along a direction from the fourth surface toward the third surface.

13. The electronic device of claim 1, further comprising:
- a second support member coupled to the printed-circuit board so as to face the second surface; and
- a flexible member disposed between the printed-circuit board and the second support member.

14. The electronic device of claim 1, wherein the housing comprises an exterior member, which is coupled to the support member so as to face the fourth surface and comprises a fifth through-hole at least partially overlapping the third through-hole and a sixth through-hole at least partially overlapping the fourth through-hole.

15. The electronic device of claim 14, further comprising an adhesive member disposed between the support member and the exterior member.

* * * * *